(12) United States Patent
Pierrat

(10) Patent No.: US 7,585,595 B2
(45) Date of Patent: *Sep. 8, 2009

(54) PHASE SHIFT MASK INCLUDING SUB-RESOLUTION ASSIST FEATURES FOR ISOLATED SPACES

(75) Inventor: Christophe Pierrat, Santa Clara, CA (US)

(73) Assignee: Synopsys, Inc., Mountain View, CA (US)

(*) Notice: Subject to any disclaimer, the term of this patent is extended or adjusted under 35 U.S.C. 154(b) by 923 days.

This patent is subject to a terminal disclaimer.

(21) Appl. No.: 10/920,027

(22) Filed: Aug. 17, 2004

(65) Prior Publication Data
US 2005/0042527 A1   Feb. 24, 2005

Related U.S. Application Data

(63) Continuation of application No. 10/244,226, filed on Sep. 16, 2002, now Pat. No. 6,777,141, which is a continuation-in-part of application No. 09/669,367, filed on Sep. 26, 2000, now Pat. No. 6,541,165.

(60) Provisional application No. 60/215,938, filed on Jul. 5, 2000.

(51) Int. Cl.
*G03F 1/00* (2006.01)

(52) U.S. Cl. .......................................... 430/5

(58) Field of Classification Search ............. 430/5, 430/311; 716/19–21
See application file for complete search history.

(56) References Cited

U.S. PATENT DOCUMENTS 4,037,918 A   7/1977 Kato ........................ 350/3.5

(Continued)

FOREIGN PATENT DOCUMENTS

DE   195 45 163 A1   6/1996

(Continued)

OTHER PUBLICATIONS

Ackmann, P. et al., "Phase Shifting And Optical Proximity Corrections To Improve CD Control On Logic Devices In Manufacturing For Sub 0.35 μm I-Line", Advance Micro Devices (8 pages).

(Continued)

*Primary Examiner*—Stephen Rosasco
(74) *Attorney, Agent, or Firm*—Kenta Suzue; Haynes Beffel & Wolfeld LLP

(57) ABSTRACT

A method extends the use of phase shift techniques to complex layouts, and includes identifying a pattern, and automatically mapping the phase shifting regions for implementation of such features. The pattern includes small features having a dimension smaller than a first particular feature size, and at least one relatively large feature, the at least one relatively large feature and another feature in the pattern having respective sides separated by a narrow space. Phase shift regions are laid out including a first set of phase shift regions to define said small features, and a second set of phase shift regions to assist definition of said side of said relatively large feature. An opaque feature is used to define the relatively large feature, and a phase shift region in the second set is a sub-resolution window inside the perimeter of the opaque feature.

24 Claims, 10 Drawing Sheets
(4 of 10 Drawing Sheet(s) Filed in Color)

U.S. PATENT DOCUMENTS

| | | | |
|---|---|---|---|
| 4,231,811 A | 11/1980 | Somekh et al. | 148/1.5 |
| 4,456,371 A | 6/1984 | Lin | 355/71 |
| 4,902,899 A | 2/1990 | Lin et al. | 250/492.1 |
| 5,242,770 A | 9/1993 | Chen et al. | 430/5 |
| 5,246,800 A | 9/1993 | Muray | |
| 5,256,505 A | 10/1993 | Chen et al. | 430/5 |
| 5,302,477 A | 4/1994 | Dao et al. | 430/5 |
| 5,308,741 A | 5/1994 | Kemp | 430/312 |
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,447,810 A | 9/1995 | Chen et al. | 430/5 |
| 5,472,814 A | 12/1995 | Lin | |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,002 A | 6/1997 | Garofalo | 355/53 |
| 5,636,131 A | 6/1997 | Liebmann et al. | 364/490 |
| 5,702,847 A | 12/1997 | Tarumoto et al. | |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | |
| 5,766,806 A | 6/1998 | Spence | |
| 5,807,649 A | 9/1998 | Liebmann et al. | 430/5 |
| 5,811,211 A | 9/1998 | Tanaka et al. | |
| 5,821,014 A | 10/1998 | Chen et al. | 430/5 |
| 5,827,623 A | 10/1998 | Ishida et al. | 430/5 |
| 5,858,580 A | 1/1999 | Wang et al. | 430/5 |
| 5,885,734 A | 3/1999 | Pierrat et al. | 430/5 |
| 5,923,562 A | 7/1999 | Liebmann et al. | |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,010,807 A | 1/2000 | Lin | 430/5 |
| 6,040,892 A | 3/2000 | Pierrat | |
| 6,057,063 A | 5/2000 | Liebmann et al. | 430/5 |
| 6,066,180 A | 5/2000 | Kim et al. | 716/19 |
| 6,077,630 A | 6/2000 | Pierrat | 430/5 |
| 6,083,275 A | 7/2000 | Heng et al. | 716/19 |
| 6,096,458 A | 8/2000 | Hibbs | |
| 6,114,071 A | 9/2000 | Chen et al. | 430/5 |
| 6,130,012 A | 10/2000 | May et al. | |
| 6,139,994 A | 10/2000 | Broeke et al. | |
| 6,185,727 B1 | 2/2001 | Liebmann | 716/19 |
| 6,228,539 B1 | 5/2001 | Wang et al. | 430/5 |
| 6,249,904 B1 | 6/2001 | Cobb | 716/21 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | |
| 6,338,922 B1 | 1/2002 | Liebmann et al. | 430/5 |
| 6,391,501 B1 | 5/2002 | Ohnuma | |
| 6,420,074 B2 | 7/2002 | Wang et al. | 430/5 |
| 6,436,590 B2 | 8/2002 | Wang et al. | 430/5 |
| 6,664,009 B2 | 12/2003 | Liu | |
| 2001/0000240 A1 | 4/2001 | Wang et al. | 430/5 |
| 2001/0028985 A1 | 10/2001 | Wang et al. | 430/5 |
| 2002/0127479 A1 | 9/2002 | Pierrat | 430/5 |
| 2002/0129327 A1 | 9/2002 | Pierrat et al. | 716/19 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| EP | 0 464 492 A1 | 1/1992 |
| EP | 0 653 679 A2 | 5/1995 |
| EP | 0 698 821 | 2/1996 |
| GB | 2333613 A | 7/1999 |
| JP | 62067547 | 3/1987 |
| JP | 01-195450 | 8/1989 |
| JP | 1-283925 | 11/1989 |
| JP | 2-140743 | 5/1990 |
| JP | 7-111528 | 2/1991 |
| JP | 3-210560 | 9/1991 |
| JP | 6-67403 | 3/1994 |
| JP | 8-51068 | 2/1996 |
| JP | 8-236317 | 9/1996 |
| JP | 2650962 | 5/1997 |
| JP | 10-133356 | 5/1998 |
| JP | 2638561 | 4/1999 |
| JP | 11-143085 | 5/1999 |
| JP | 11-212247 A | 8/1999 |
| WO | WO 97/45772 | 12/1997 |
| WO | WO 98/12605 A1 | 3/1998 |
| WO | WO 98/38549 | 9/1998 |
| WO | WO 99/27420 | 6/1999 |
| WO | WO 99/47981 | 9/1999 |
| WO | WO 00/19272 | 4/2000 |
| WO | WO 00/67076 A1 | 11/2000 |
| WO | WO 01/23961 A1 | 4/2001 |
| WO | WO 02/03140 A1 | 1/2002 |

OTHER PUBLICATIONS

Asai, S. et al., "High Performance Optical Lithography Using A Separated Light Source", *J. Vac. Sci. Technol. B*, vol. 10, No. 6, pp. 3023-3026, Nov./Dec. 1992.

Barouch, E. et al., "OPTIMASK: An OPC Algorithm For Chrome And Phase-Shift Mask Design", *SPIE*, vol. 2440, pp. 192-206, Feb. 1995.

Brunner, T. et al., "170nm Gates Fabricated By Phase-Shift Mask And Top Anti-Reflector Process", *SPIE*, Optical/Laser Microlithography VI, vol. 1927, pp. 182-189 (1993).

Brunner, T. et al., "Approximate Model For Resist Processing Effects", *SPIE*, vol. 2726, pp. 198-207, Mar. 1996.

Fukuda, H. et al., "Determination of High-Order Lens Aberration Using Phase/Amplitude Linear Algebra", *J. Vac. Sci. Technol. B*, vol. 17, No. 6, pp. 3318-3321, Nov./Dec. 1999.

Fukuda, H., "Node-Connection/Quantum Phase-Shifting Mask: Path To Below 0.3 µm Pitch, Proximity Effect Free, Random Interconnects And Memory Patterning", *J. Vac. Sci. Technol. B*, vol. 17, No. 6, pp. 3291-3295, Nov./Dec. 1999.

Inokuchi, K. et al., "Sub-Quarter Micron Gate Fabrication Process Using Phase-Shifting-Mask For Microwave GaAs Devices", Extended Abstracts of the 1991 Intl. Conference on Solid State Devices and Materials, Yokohama, Japan, pp. 92-94 (1991).

Inokuchi, K. et al., "Sub-Quarter-Micron Gate Fabrication Process Using Phase-Shifting Mask For Microwave GaAs Devices", *Japanese Journal of Applied Physics*, vol. 30, No. 12B, pp. 3818-3821, Dec. 1991.

Ishiwata, N. et al., "Novel Alternating Phase Shift Mask With Improved Phase Accuracy", *SPIE*, Proceedings of the 17th Annual Symposium on Photomask Technology and Management, vol. 3236, pp. 243-249 (1997).

Jinbo, H. et al., "0.2 µm Or Less i-Line Lithography By Phase-Shifting-Mask Technology", *IEEE*, pp. 33.3.1-33.3.4 (1990).

Jinbo, H. et al., "Application Of Blind Method To Phase-Shifting Lithography", *IEEE*, 1992 Symposium on VLSI Technology Digest of Technical Papers, pp. 112-113 (1992).
Jinbo, H et al., "Improvement Of Phase-Shifter Edge Line Mask Method", *Japanese Journal of Applied Physics*, vol. 30, No. 11B, pp. 2998-3003, Nov. 1991.
Karklin, L., "A Comprehensive Simulation Study Of The Photomask Defects Printability", *SPIE*, vol. 2621, pp. 490-504 (1995).
Kimura, T. et al., "Subhalf-Micron Gate GaAs Mesfet Process Using Phase-Shifting-Mask Technology", *IEEE*, GaAs IC Symposium, pp. 281-284 (1991).
Levenson, M. et al., "Improving Resolution In Photolithography With A Phase-Shifting Mask", *IEEE Transactions on Electron Devices*, vol. ED-29, No. 12, pp. 1828-1836, Dec. 1982.
Lin, B.J., "Phase-Shifting Mask Gain An Edge", *IEEE* Circuits & Devices, pp. 28-35, Mar. 1993.
Liu, H. Y. et al., "Fabrication of 0.1 μm T-Shaped Gates By Phase-Shifting Optical Lithography", *SPIE*, Optical/Laser Microlithography VI, vol. 1927, pp. 42-52 (1993).
Matsuoka, K. et al., "Application Of Alternating Phase-Shifting To 0.16 μm CMOS Logic Gate Patterns", Matsushita Electric Ind. Co., Ltd. (9 pages.)
Mizuno, F. et al., "Practical Phase-Shifting Mask Technology For 0.3 μm Large Scale Integrations", *J. Voc. Sci. Technol. B*, vol. 12, No. 6, pp. 3799-3803, Nov./Dec. 1994.
Morimoto, H. et al., "Next Generation Mask Strategy—Technologies Are Ready For Mass Production Of 256MDRAM?", *SPIE*, vol. 3236, pp. 188-189 (1997).
Neureuther, A., "Modeling Phase Shifting Masks", *SPIE*, $10^{th}$ Annual Symposium on Microlithography, vol. 1496, pp. 80-85 (1990).
Nistler, J. et al., "Large Area Optical Design Rule Checker For Logic PSM Application", *SPIE*, Photomask and X-Ray Mask Technology, vol. 2254, pp. 78-92 (1994).
Nistler, J. et al., "Phase Shift Mask Defect Printability Analysis", Proceedings of the Microlithography Seminar Interface '93, OCG Microelectronic Materials, Inc., pp. 11-28 (1993).
Ohtsuka, H. et al., "Phase Defect Repair Method For Alternating Phase Shift Masks Conjugate Twin-Shifter Method", *Jpn. J. Appl. Phys.*, vol. 31, pp. 4143-4149 (1992).
Pati, Y.C. et al., "Phase-Shifting Masks For Microlithography: Automated Design And Mask Requirements", *J. Opt. Soc. Am.*, vol. 11, No. 9, pp. 2438-2452, Sep. 1994.
Pierrat, C. et al., "A Rule-Based Approach To E-Beam And Process-Induced Proximity Effect Correction For Phase-Shifting Mask Fabrication", *SPIE*, vol. 2194, pp. 298-309 (1994).
Pierrat C. et al., "Phase-Shifting Mask Topography Effects On Lithographic Image Quality", *IEEE*, pp. 3.3.1-3.3.4 (1992).
Rieger, M. et al., "System For Lithography Proximity Compensation", Precim Company, Portland, Oregon, Sep. 1993, (28 pages).
Roman, B. et al., "Implications Of Device Processing On Photomask CD Requirements", *SPIE*, vol. 3236 (1997) (Abstract Only).
Spence, C. et al., "Automated Determination Of CAD Layout Failures Through Focus: Experiment And Simulation," *SPIE*, vol. 2197, pp. 302-313 (1994).
Spence, C. et al., "Detection of 60° Phase Defects On Alternating PSMs", Advance Micro Devices, KLA-Tencor, DuPont RTC (2 pages).
Spence, C. et al., "Integration Of Optical Proximity Correction Strategies in Strong Phase Shifters Designs For Poly-Gate Layers", *Bacus News*, vol. 15, Issue 12, pp. 1, 4-13, Dec. 1999.
Stimiman, J. et al., "Wafer Proximity Correction And Its Impact On Mask-Making", *Bacus News*, vol. 10, Issue 1, pp. 1, 3-7, Jan. 10-12, 1994.
Sugawara, M. et al., "Defect Printability Study Of Attenuated Phase-Shifting Masks For Specifying Inspection Sensitivity", Semiconductor Company, Sony Corporation, Kanagawa, Japan (16 pages).
Terasawa, T. et al., "0.3-Micron Optical Lithography Using A Phase-Shifting Mask", *SPIE*, Optical/Laser Microlithography II, vol. 1088, pp. 25-33, Mar. 1989.
Watanabe, H. et al., "Detection And Printability Of Shifter Defects In Phase-Shifting Mask II Defocus Characteristics", *Jpn. J. Appl. Phys.*, vol. 31, pp. 4155-4160 (1992).

Wiley, J. et al., "Phase Shift Mask Pattern Accuracy Requirements And Inspection Technology", *SPIE*, Integrated Circuit Metrology, Inspection, and Process Control V. vol. 1464, pp. 346-355 (1991).
Schmidt, R., et al., "Impact of Coma on CD Control for Multiphase PSM Designs". AMD, ASML (11 pages).
Erdmann, A., "Topography Effects and Wave Aberrations in Advanced PSM-Technology", Fraunhofer Institute of Integrated Ciricuits (11 pages).
Granik, Y., et al., "CD Variation Analysis Technique and its Application to the Study of PSM Mask Misalignment", Mentor Graphics (9 pages).
Hanyu, et al., "New Phase-Shifting Mask with Highly Transparent Si02 Phase Shifters", Fujitsu Laboratories Ltd. (11 pages).
Ishiwata, N., et al., "Fabrication of Phase-Shifting Mask", Fujitsu Ltd. (11 pages).
Levenson, M., et al., "Phase Phirst! An Improved Strong-PSM Paradigm", M.D. Levenson Consulting, Petersen Advanced Lithography, KLA-Tencor (10 pages).
Levenson. M., et al., "SCAA Mask Exposures and Phase Phirst Design for 110nm and Below", M.D. Levenson Consulting, Canon USA, Inc., JSR Microelectronics, Inc. (10 pages).
Lin, B.J., "The Relative Importance of the Building Blocks for 193nm Optical Lithography", Linnovation, Inc. (12 pages).
McCallum, M., et al., "Alternating PSM Mask Performance—a Study of Multiple Fabrication Technique Results", International SEMATECH (6 pages).
Morikawa, Y., et al., "100nm-alt.PSM Structure Discussion for ArF Lithography", Dai-Nippon Printing Co., Ltd. (15 pages).
Ozaki, T., et al., "A 0.15um KrF Lithography for 1Gb DRAM Product Using Highly Printable Patterns and Thin Resist Process", Toshiba Corporation (2 pages).
Rhyins, P., et al., "Characterization of Quartz Etched PSM Masks for KrF Lithography at the 100nm Node", Photronics, Inc., MIT Lincoln Lab, ARCH Chemicals, Finle Technologies, KLA Tencor Corp (10 pages).
Ronse, K., et al., "Thin Film Interference Effects in Phase Shifting Masks Causing Phase and Transmittance Errors", IMEC (15 pages).
Rosenbluth, A., et al., "Optimum Mask and Source Patterns to Print a Given Shape", IBM (17 pages).
Sakata, M., et al., "A Novel Radiation Sensitive Spin-on-Glass Convertible into SiO2 and the Simple Fabrication Process Using It", OKj Electric Industry Co. Ltd. (3 pages).
Schmidt, R., et al., "Impact of Coma on CD Control for Multiple PSM Designs", AMD, ASML (10 pages).
Sewell, H., et al., "An Evaluation of the Dual Exposure Technique", SVG Lithography Systems Inc. (11 pages).
Spence, C., et al., "Optimization of Phase-Shift Mask Designs Including Defocus Effects", AMD, Princeton University, Vecor Technologies Inc. (8 pages).
Suzuki, A., et al., "Multilevel Imaging System Realizing k1=.3 Lithography", Canon Inc. (13 pages).
Vandenberghe, G., et al., "(Sub-)100nm Gate Patterning Using 248nm Alternating PSM", IMEC, Mentor Graphics (9 pages).
Fritze, M. et al., "100-nm Noble Lithography with KrF?", MIT Lincoln Lab, Numberical Technologies, Photronics, Arch Chemicals (14 pages).
Fukuda, H., et al., "Patterning of Random Interconnect Using Double Exposure of Strong-Type PSMs", Hitachi Central Research Lab (8 pages).
Ferguson, R., et al., "Pattern-Dependent Correction of Mask Topography Effects for Alternating Phase-Shifting Masks", IBM Microelectronics, University of California Berkeley (12 pages).
Toublan, O. et al. "Phase and Transmission Errors Aware OPC Solution for PSM: Feasibility Demonstration", Mentor Graphics Corp. (7 pages).
Yanagishita Y., et al., "Phase-Shifting Photolithography Applicable to Real IC Patterns", Fujitsu Ltd. (11 pages).
Levenson, M., et al., "The Phase-Shifting Mask II: Imaging Simulations and Submicrometer Resist Exposures", IEEE Transactions on Electron Devices, vol. ED-31, No. 6, pp. 753-763, Jun. 1984.
IBM, "Method to Produce Sizes in Openings in Photo Images Smaller Than Lithographic Minimum Size", IBM Technical Disclosure Bulletin, vol. 29, No. 3, p. 1328, Aug. 1986.

Buraschi, M., et al., "Optical-Diffraction-Based Modulation of Photoresist Profile or Microlithography Applications", Optical Engineering, vol. 28, No. 6, pp. 654-658, Jun. 1989.
Nitayama, A., et al., "New Phase Shifting Mask with Self-Aligned Phase Sifters for a Quartrer Micron Photolithography", IEDM, pp. 3.3.1-3.3.4, Dec. 3-6, 1989.
Tob, K., et al., "Chromeless Phase-Shifted Masks: A New Approach to Phase-Shifting Masks", BACUS—Tenth Annual Symposium on Microlithography. Sep. 1990 (27 pages).
Yamanaka, T., et al., "A 5.9um2 Super Low Power SRAM Cell Using a New Phase-Shift Lithography", IEDM, pp. 18.3.1-18.3.4 (1990).
Nakagawa, K., et al., "Fabrication of 64m DRAM with I-Line Phase-Shift Lithography", IEDM, pp. 33.1.1-33.14 (1990).
Watanabe, H., et al., "Transparent Phase Shifting Mask", IEDM, pp. 33.2.1-33.2.4 (1990).
Burggraaf, P., "Four More Significant Japanes Advances in Phase Shifting Technology"Semiconductor International, p. 16, Dec. 1991.
Kemp, K., et al., "Optimized Phase Shift Mask Designs for Real Devices", KTI Microlithography Seminar. pp. 67-75, Oct. 14-15, 1991.
Newmark, D., et al., "Phase-Shiftihg Mask Design Tool", SPIE—11th Annual BACUS Symposium on Photmask Technology, vol. 1604, pp. 226-235, Sep. 25-27, 1991.
Nolscher, C., et al., "Investigation of Self-Aligned Phase-Shifting Reticles by Simulation Techniquies" SPIE—Optical/Laser Microlithography IV, vol. 1463. pp. 135-150 (1991).
Burggraaf, P., et al., "Lithography's Leading Edge, Part I: Phase-Shift Technology and Part 2: I-Line and Beyond", Semiconductor International pp. 43-47 and 52-56, Feb. 1992.
Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229-235 (1992).
IBM, "Phase-Shift Mask Utilizing Silicon Oxy-Nitride as a Low Reflectivity Phase-Shift Layer", IBM Technical Disclosure Bulletin, vol. 34, No. 10B, pp. 360-361, Mar. 1992.
Brunner, T., "Rim Phase-Shift Mask Combined with Off-Axis Illumination: A Path to 0.5(lampda) / Numerical Aperture Geometries", Optical Engineering, vol. 32, No. 10, pp. 2337-2343, Oct. 1993.
Ronse, K., et al., "Comparison of Various Phase Shift Strategies and Application to 0.35um ASIC Designs", SPIE—Optical/Laser Microlithography VI, vol. 1927, pp. 2-16 (1993).
Troccolo, P., et al., "Interferometric Measurement of Etch Depths in Phase Shift Masks", BACUS News, vol. 9, Issue 6, pp. 1 & 4-6, Jun. 1993.
Watanabe, H., et al., "Phase-Shifting Lithography: Maskmaking and its Application", J. Vac. Sci. Technol. B, vol. 11, No. 6, pp. 2669-2674, Nov./Dec. 1992.
Galan, G., et al., "Application of Alternating—Type Phase Shuft Mask to Polysilicon Level for Random Logic Circuits", Jpn. J. Appl. Phys., vol. 33, pp. 6779-6784 (1994).
Waas. T., et al., "Automatic Generation of Phase Shift Mask Layouts", Microelectronic Engineering, vol. 23, pp. 139-142 (1994).
Langston, J., et al., "Extending Optical Lithography to 0.25um and Below", Solid State Technology, pp. 57-64, Mar. 1995.
Nagahiro, Y., "Improved Mask Technique for Photolithography Applied to 0.25um LSI—Improvement of Resolution, Pattern Correction, Exposure Area", Nikkei Microdevices. pp. 1-6, Apr. 1995.
Okamoto, Y., et al., "A New Phase Shifting Mask Technology for Quarter Micron Photolithography", SPIE, vol. 2512, pp. 311-318 (1995).
Pierrat, C., et al., "Required Optical Characteristics of Materials for Phase-Shifting Masks", Applied Optics, vol. 34, No. 22, pp. 4923-4928, Aug. 1, 1995.
Galan, G., et al., "Alternating Phase Shift Generation for Coplex Circuit Designs", SPIE , vol. 2884, pp. 508-519, Sep. 18-20, 1996.
Kanai, H., et al., "Sub-Quarter Micron Lithography with the Dual-Trench Type Alternating PSM", SPIE, vol. 2793, pp. 165-173 (1996).
Ishida, S., et al., "Large Assist Feature Phase-Shift Mask for Sub-Quarter Micrometer Window Pattern Formation", SPIE, vol. 3096, pp. 333-343 (1997).

Nakae, A., et al., "A Proposal for Pattern Layout Rule in Application of Alternating Phase Shift Mask", SPIE, vol. 3096, pp. 362-374 (1997).
Tsujimoto, E., et al., "Hierarchical Mask Data System (PROPHET) for Aerial Image Simulation, Automatic Phase-Shifter Placement, and Subpeak Overlap Checking", SPIE, vol. 3096, pp. 163-172 (1997).
Yamamoto, K., et al., "Hierarchical Processing of Levenson-Type Phase Shifter Generation", Jpn. J. Appl. Phys., vol. 36, Part 1, No. 12B, pp. 7499-7503, Dec. 1997.
Gordon, R, et al., "Design and Analysis of Manufacturable Alternating Phase-Shifting Masks", Bacus News, vol. 14, Issue 12, pp. 1-9, Dec. 1998.
Nara, M. et al., "Phase Controllability Improvement for Alternating Phase Shift Mask", Dai Nippon Printing Co., Ltd, (16 pages).
Petersen, J., et al., "Designing Dual-Trench Alternating Phase-Shift Masks for 140nm and Smaller Features Using 248-nm KrF and 193-nm ArF Lithography", Bacus News, vol. 14, Issue 8, pp. 1 & 4-13, Aug. 1998.
Kuo, C., et al., "Extension of Deep-Ultraviolet Lithography for Patterning Logic Gates Using Alternating Phase Shifting Masks", J. Vac. Sci. Technol B. vol. 17, No. 6, pp. 3296-3300, Nov./Dec. 1999.
Palmer, S., et al., "Dual Mask Model-Based Proximity Correction for High Performance 0.10um CMOS Process", The 44th International Conference on Electron, Ion and Photon Beam Technology and Nanofabrication Abstracts, pp. 18-19, May 30-Jun. 2, 2000.
Chen, J.F., et al., "Optical Proximity Correction for Intermediate-Pitch Features Using Sub-Resolution Scattering Bars", MicroUnity Systems Engineering Inc., Sunnyvale, California, pp. 1-16.
Chen, J.F., et al., "Practical Method for Full-Chip Optical Proximity Correction", MicroUnity Systems Engineering, Inc., Sunnyvale, California (14 pages).
Microunity, "OPC Technology & Product Description", MicroUnity Systems Engineering, Inc., pp. 1-5.
Wang, R., et al., "Plarized Phase Shift Mask: Concept, Design, and Potential Advantages to Photolithography Process and Physical Design", Motorola Semiconductor Product Sector (12 pages).
Ogawa, K., et al., "Phase Defect Inspection by Differential Interference", Lasertec Corporation (12 pages).
Pistor, T., "Rigorous 3D Simulation of Phase Defects in Alternating Phase-Shifting Masks", Panoramic Technology Inc. (13 pages).
Semmier, A., et al., "Application of 3D EMF Simulation for Development and Optimization Alternating Phase Shifting Masks", Infineon Technologies AG (12 pages).
Wong, A., et al., "Polarization Effects in Mask Transmission", University of California Berkeley (8 pages).
Hirai, Y., et al., "Automatic Pattern Generation System for Phase Shifting Mask", 1991 Symposium on VLSI Technology, Digest of Technical Papers, pp. 95-96, May 28-30, 1991.
Wong, A., et al., "Investigating Phase-Shifting Mask Layout Issues Using a Cad Toolkit", IEEE, pp. 27.4.1-27.4.4 (1991).
Terasawa, T., et al., "Imaging Characteristics of Multi-Phase-Shifting and Halftone Phase-Shifting Masks", Japanese Journal of Applied Physics, vol. 30, No. 11B, pp. 2991-2997, Nov. 1991.
Inoue, S., et al., "Simulation Study on Phase-Shifting Masks for Isolated Patterns", Japanese Journal of Applied Physics, vol. 30, No. 11B, pp. 3010-3015, Nov. 1991.
Watanabe, H., et al., "Detection and Printability of Shifter Defects in Phase-Shifting Masks", Japanese Journal of Applied Physics, vol. 30, No. 11B, pp. 3016-3020, Nov. 1991.
Watanabe, H., et al., "Pattern Transfer Characteristics of Transparent Phase Shifting Mask", Japanese Journal of Applied Physics, vol. 30, No. 11B, pp. 3004-3009, Nov. 1991.
Garofalo, J., et al., "Mask Assisted Off-Axis Illumination Technique for Random Logic", J. Vac. Sci. Technol. B, vol. 11, No. 6, pp. 2651-2658, Nov./Dec. 1993.
Moniwa, A., et al., "Algorithm for Phase-Shift Mask Design with Priority on Shifter Placement", Jpn. J. Appl. Phys., vol. 32. Pt. 1, No. 12B, pp. 5874-5879, Dec. 1193.
Ooi, K., et al., "Computer Aided Design Software for Designing Phase-Shifting Masks", Jpn. J. Appl. Phys., vol. 32, Pt. 1, No. 12B, pp. 5887-5891, Dec. 1993.

Ohtsuka, H., et al., "Evaluation of Repair Phase and Size Tolerance for a Phase-Shift Mask", J. Vac. Sci. Technol. B, vol. 11, No. 6, pp. 2665-2668, Nov./Dec. 1993.

Garofalo, J., et al., "Automated Layout of Mask Assist-Features for Realizing 0.5k1 ASIC Lithography", SPIE, vol. 2440, pp. 302-312 (1995).

Moniwa, A., et al., "Heuristic Method for Phase-Conflict Minimization in Automatic Phase-Shift Mask Design", Jpn. J. Appl. Phys., vol. 34, Pt. 1, No. 12B, pp. 6584-6589, Dec. 1995.

Chen, J.F., et al., "Full-Chip Optical Proximity Correction with Depth of Focus Enhancement", Microlithography World (5 pages) (1997).

Chen, J. Fung, et al., "High-T, Tenary Attenuating PSMs for the 130nm Node", Microlithography World, pp. 12, 14, 16, 18, 20 & 30 (2000).

Kikuchi, K., et al., "Method of Expanding Process Window for the Double Exposure Technique with alt-PSMs", Optical Microlithography XIII, Proceeding of SPIE, vol. 4000, pp. 121-131 (2000).

Schellenberg, F., et al., "Optimization of Real Phase Mask Performance", SPIE—11th Annual Symposium on Photomask Technology, vol. 1604, pp. 274-296, Sep. 25-27, 1991.

Ohnuma, H., et al., "Lithography Computer Aided Design Technology for Embedded Memory in Logic", Jpn. J. Appl. Phys., vol. 37, Part I, No. 12B. pp. 6686-6688, Dec. 1998.

Cooke, M., "OPC/PSM Designs For Poly Gate Layers", European Semiconductor, vol. 22, No. 7, pp. 57-59, Jul. 2000.

Granik, Y., et al., "Sub-Resolution Process Windows And Yield Estimation Technique Based On Detailed Full-Chip CD Simulation", SPIE, vol. 4182, pp. 335-341 (2000).

Plat, M., et al., "The Impact of Optical Enhancement Techniques on the Mask Error Enhancement Funchtion (MEEF)", SPIE, vol. 4000, pp. 206-214, Mar. 1-3, 2000.

Mansuripur, M., et al., "Projection Photolithography", Optics & Photonics News 11, 17 pages, Feb. 2000.

Schellenberg, F., et al., "Optimization of Real Phase Mask Performance," SPIE—11th Annual Symposium of Photmask Technology, vol. 1604, pp. 274-296, Sep. 25-27, 1991.

Ohnuma, H., et al., "Lithography Computer Aided Design Technology for Embedded Memory in Logic," Jpn. J. Appl. Phys., vol. 37, Part. I. No. 12B, pp. 6686-6688, Dec. 1998.

Cooke, M. "OPC/PSM Designs for Poly Gate Layers." European Semiconductor, vol. 22, No. 7, pp. 57-59, Jul. 2000.

Ackmann, P., et al "Phase Shifting and Optical Proximity Corrections to Improve CD Control on Logic Devices in Manufacturing for Sub 0.35 µm l-Line", Advance Micro Devices, SPIE v. 3051, Jul. 1997 pp. 146-153.

Matsuoka, K. et al. "Appilcation of Alternating Phase-Shifting Mask to 0.16 µm CMOS Logic Gate Patterns", Matsushita Electric Ind. Co., Ltd., Proc. SPIE v. 3051, Jul. 1997, pp. 342-351.

Spence, C., et al. "Detection of 60° Phase Defects on Alternating PSMs", Advance Micro Devices, KLA Tencor, Dupont RTC, Proc. SPIE v. 3412, Sep. 1998, (2 pages).

Sugawara, M., et al. "Defect Printability Study of Attenuated Phase-Shifting Masks for Specifying Inspection Sensitivity", Semiconductor Company, Sony Corporation, Kanagawa, Japan, Proc. SPIE v. 2621, Dec. 1995 pp. 457-472.

Schmidt, R. et al. "Impact of Coma on CD Controls for Multiphase PSM Designs", AMD, ASMML Proc. SPIE v. 3334, Jun. 1998 pp. 15-24.

Erdmann, A., "Topography Effects and Wave Aberrations in Advanced PSM-Technology", Fraunhofer Institute of Intergrated Circuits, Proc. SPIE v. 4346 Sep. 2001, pp. 345-355.

Granik, Y., et al. "CD Variation Analysis Technique and its Application to the Study of PSM Mask Misalignment", Mentor Graphics, Proc. SPIE v. 4186, Jan. 2001, pp. 853-861.

Hanyu et al., "New Phase-Shifting Mask with Highly Transparent SiO2 Phase Shifters", Fujitsu Laboratories, Proc. SPIE v. 1264 Jun. 1990, pp. 167-177.

Ishiwata, N., et al. "Fabrication of Phase-Shifting Mask", Fujitsu Limited, Proc. SPIE v. 1463 Jul. 1991, pp. 423-433.

Levenson, M., et al. "Phase Phirst! An Improved Strong-PSM Paradigm", M.D. Levenson Consulting, Petersen Advanced Lithography, KLA-Tencor, Proc. SPIE v. 4186 Jan. 2001, pp. 395-404.

Levenson, M., et al. "SCAA Mask Exposures and Phase Phirst Design for 110nm and Below", M.D. Levenson Consulting, Canon USA, Inc., JSR Microelectronics, Inc. Proc. SPIE v. 4346, Sep. 2001 pp. 817-826.

Lin, B.J. "The Relative Importance of the Building Blocks foe 193nm Optical Lithography", Linnovation, Inc. First Seminar on 193nm Optical Lithography Mar. 27, 1998 (12 pages).

McCallum, M., et al. "Alternating PSM Mask Performance - a Study of Multiple Fabrication Technique Results", International SEMATECH Proc. SPIE v. 4346 Sep. 2001, pp. 723-728.

Morikawa, Y., et al. "100nm-alt. PSM Structure Discussion for ArF Lithography", Dai-Nippon Printing Co., Ltd., Proc. SPIE v. 4409 Sep. 2001, pp. 132-146.

Ozaki, T., et al. "A 0.15nm KrF Lithography for 1Gb DRAM Product Using Highly Printable Patterns and Thin Resist Process", Toshiba Corporation VLSI Tech. 1998 Digest Tech Papers Jun. 1998, pp. 84-85.

Rhyins, P., et al. "Characterization of Quartz Etched PSM Masks for KrF Lithography at the 100nm Node" Photronics, Inc. MIT Lincoln Lab, ARCH Chemicals, Finle Technologies, KLA Tencor Corp. SPIE v. 4562 Mar. 2002, pp. 486-495.

Ronse, K., et al. "Thin Film Interference Effects in Phase Shifting Masks Causing Phase and Transmittance Errors" IMEC J. Vacuum Science & Tech B 10: Nov. 6, 1992, pp. 3012-3018.

Rosenbluth, A., et al. "Optimum Mask and Source Patterns to Print a Given Shape", IBM J. Microlithogr. Microfabrication, Microsyst. V. 1 Proc. SPIE v. 4346 Sep. 2001 pp. 486-502.

Sakata, M., et al. "A Novel Radiation Sensitive Spin-on-Glass Convertible into SiO2 and the Simple Fabrication Process Using It", Oki Electric Industry Co., ltd. 1993 (3 pages).

Schmidt R., et al. "Impact of Coma on CD Control for Multiphase PSM Designs", AMD, ASML, Proc. SPIE v. 3334 Jun. 1998 pp. 15-24.

Sewell, H., et al. "Evaluation of the Dual Exposure Technique", SVG Lithography Systems, Inc. Proc. SPIE v. 4344 Aug. 2001, pp. 323-333.

Spence, C., et al. "Optimization of Phase-Shift Mask Designs Including Defocus Effects" AMD, Princeton University, Vecor Technologies, Inc. SPIE Microlithography Conf. 1993/1994 (8 pages).

Suzuki, A., et al. "Multilevel Imaging System Realizing k1=.3 Lithography" Canon Inc. Proc. SPIE v. 3679 Jul. 1999 pp. 396-407.

Vandenberghe, G., et al. "(Sub-) 100nm Gate Patterning Using 248nm Alternating PSM" IMEC, Mentor Graphics Proc. SPIE v. 4409 Sep. 2001 pp. 61-69.

Fritze, M., et al. "100-nm Node Lithography with KrF?", MIT Lincoln Lab, Numerical Technologies, Photronics, Arch Chemicals Proc. SPIE v. 4346 Sep. 2001 pp. 191-204.

Fukuda H., et al. "Patterning of Random Interconnect Using Double Exposure of Strong-Type PSMs" Hitachi Central Research Lab Proc. SPIE v. 4346 Sep. 2001 pp. 695-702.

Ferguson R., et al. "Pattern-Dependent Correction of Mask Topography Effects for Alternating Phase-Shifting Masks" IBM Microelectronics, University of California Berkeley Proc. SPIE v. 2440 May 1995 pp. 349-360.

Toublan, O., et al. "Phase and Transmission Errors Aware OPC Solution for PSM: Feasability Demonstration" Mentor Graphics Corp. Proc. SPIE v. 4186 Jan. 2001 pp. 862-868.

Yanagishita, Y., et al. "Phase-Shifting Photolithography Applicable to Real IC Patterns" Fujitsu Limited Proc. SPIE v. 1463 Jul. 1991 pp.207-217.

Nara, M., et al. "Phase Controllability Improvement for Alternating Phase Shift Mask" Dai Nippon Printing Co., Ltd. Proc. SPIE v. 3456 Sep. 1998 pp. 253-269.

Chen, J.F., et al. "Optical Proximity Correction for Intermediate-Pitch Features Using Sub-Resolution Scattering Bars" MicroUnity Systems Engineering, Inc., Sunnyvale, California J. Vac. Sci Tech B v. 15:6 Nov.-Dec. 1997 pp. 2426-2433.

Chen, J.F. et al. "Practical Method for Full-Chip Optical Proximity Correction" MicroUnity Systems Engineering Inc., Sunnyvale, CA Proc. SPIE v. 3051 Jul. 1997 pp. 790-803.

MicroUnity, "OPC Technology & Product Description" MicroUnity Systems Engineering, Inc. 1996 pp. 1-5.

Wang, R., et al. "Polarized Phase Shift Mask: Concept, Design and Potential Advantages to Photolithography Process and Physical Design" Motorola Semiconductor Product Sector Proc. SPIE v. 4562 Mar. 2002 pp. 406-417.

Ogawa, K., et al. "Phase Defect Inspection by Differential Interference" Lasertec Corporation Proc. SPIE v. 4409 Sep. 2001 pp. 543-554.

Pistor, T. "Rigorous 3D Simultation of Phase Defects in Alternating Phase-Shifting Masks" Panoramic Technology Inc., Proc. SPIE v. 4562 Mar. 2001 pp. 1038-1050.

Semmier, A. et al., "Application of 3D EMF Simulation for Development and Optimization of Alternating Phase Shifting Masks" Infineon Technologies AG Proc. SPIE v. 4346 Feb. 27, 2001 pp. 356-367.

Wong A., et al. "Polarization Effects in Mask Transmission" University of California Berkeley Proc. SPIE v. 1674 Jun. 1992 pp. 193-200.

Sakata et al. "Direct Formation of Silicon Dioxide Mask Using A Novel Radiation-Sensitive Spin-on-Glass" VLSI Technology 1993 Digest of Technical Papers pp. 147-148.

Layout

Simulation

US 7,585,595 B2

PHASE SHIFT MASK INCLUDING SUB-RESOLUTION ASSIST FEATURES FOR ISOLATED SPACES

RELATED APPLICATION DATA

The present application is a continuation of application Ser. No. 10/244,226 filed 16 Sep. 2002, now U.S. Pat. No. 6,777,141, which application is a continuation-in-part of application Ser. No. 09/669,367, filed 26 Sep. 2000 now U.S. Pat. No. 6,541,165 entitled *Phase Shift Mask Sub-Resolution Assist Features*; which application claims the benefit of prior U.S. Provisional Application No. 60/215,938; filed 5 Jul. 2000; entitled *Phase Shift Masking for Complex Layouts*, invented by Christophe Pierrat, which is incorporated by reference as if fully set forth herein.

The present application is related to U.S. patent application Ser. No. 09/669,368, entitled *Phase Shift Masking for Intersecting Lines*, invented by Christophe Pierrat, filed 26 Sep. 2000, and owned by the same assignee now and at the time of invention, now U.S. Pat. No. 6,524,752 issued 25 Feb. 2003; and also related to U.S. patent application Ser. No. 09/669,359, entitled *Phase Shift Masking for Complex Patterns*, invented by Christophe Pierrat, filed 26 Sep. 2000, and owned by the same assignee now and at the time of invention, now U.S. Pat. No. 6,503,666.

BACKGROUND OF THE INVENTION

1. Field of the Invention

The present invention relates to manufacturing small dimension features of objects, such as integrated circuits, using photolithographic masks. More particularly, the present invention relates to the application of phase shift masking to complex layouts for integrated circuits and similar objects.

2. Description of Related Art

Phase shift masking, as described in U.S. Pat. No. 5,858,580, has been applied to create small dimension features in integrated circuits. Typically the features have been limited to selected elements of the design, which have a small, critical dimension. Although manufacturing of small dimension features in integrated circuits has resulted in improved speed and performance, it is desirable to apply phase shift masking more extensively in the manufacturing of such devices. However, the extension of phase shift masking to more complex designs results in a large increase in the complexity of the mask layout problem. For example, when laying out phase shift areas on dense designs, phase conflicts will occur. One type of phase conflict is a location in the layout at which two phase shift regions having the same phase are laid out in proximity to a feature to be exposed by the masks, such as by overlapping of the phase shift regions intended for implementation of adjacent lines in the exposure pattern. If the phase shift regions have the same phase, then they do not result in the optical interference necessary to create the desired effect. Thus, it is necessary to prevent inadvertent layout of phase shift regions in phase conflict.

Another problem with laying out complex designs which rely on small dimension features, arises because of isolated exposed spaces which may have narrow dimension between unexposed regions or lines.

Because of these and other complexities, implementation of a phase shift masking technology for complex designs will require improvements in the approach to the design of phase shift masks, and new phase shift layout techniques.

SUMMARY OF THE INVENTION

The present invention provides techniques for extending the use of phase shift techniques to implementation of masks for complex layouts in the layers of integrated circuits, beyond selected critical dimension features such as transistor gates to which such structures have been limited in the past. The invention provides a method that includes identifying features for which phase shifting can be applied, automatically mapping the phase shifting regions for implementation of such features, resolving phase conflicts which might occur according to a given design rule, and applying sub-resolution assist features within phase shift regions. The present invention is particularly suited to opaque field phase shift masks which are designed for use in combination with binary masks defining interconnect structures and other types of structures that are not defined using phase shifting, necessary for completion of the layout of the layer.

Various aspects of the invention include computer implemented methods for definition of mask layouts for corresponding complex layouts in the layers of integrated circuits to be made using such masks, methods for manufacturing masks having such mask layouts, methods for manufacturing integrated circuits having improved small dimension features implemented using the novel masks, and improved integrated circuits having the improved small dimension features.

The invention includes a method for producing photolithographic masks, and layout files for such photolithographic masks, which comprises identifying features in a pattern to be exposed having a dimension less than a particular feature size, and laying out phase shift regions using a layout rule for the identified features to produce a phase shift mask having phase shift areas. The particular feature size according to the invention need not be the critical dimension for the smallest features to be implemented. Rather, in the layout of an entire complex pattern, any feature which is suitable for implementation using phase shifting can be identified according to the present invention.

In one embodiment, the pattern to be laid out includes features having a dimension smaller than a first particular feature size (e.g., a narrow line), and at least one relatively large feature, such as a flag shaped feature. In the pattern according to this embodiment, the at least one relatively large feature and another feature (e.g. a line or another flag shaped feature) in the pattern have respective sides separated by a space between said respective sides, said space having a dimension less than a second particular feature size. Phase shift regions are laid out for the identified pattern to produce a phase shift mask, the phase shift mask having a first set of phase shift regions to define said features having a dimension smaller than a particular feature size, and a second set of phase shift regions to assist definition of said side of said relatively large feature.

In one embodiment, the process of identifying features suitable for implementation using phase shifting includes reading a layout file which identifies features of the complex pattern to be exposed.

In one preferred embodiment, the phase shift mask includes an opaque field, and the phase shift regions include a plurality of transparent regions having a first phase within the opaque field, and a plurality of complementary transparent regions having a second phase 180 degrees out of phase with respect to the first phase, within the opaque field. The opaque field leaves unexposed lines formed by the phase shift regions unconnected to other structures. A complementary mask is laid out for use is conjunction with the opaque field phase shift mask to form interconnect structures in the region blocked by the opaque field, so the features formed using the phase shift mask are integrated with larger dimension features. In one embodiment, the complementary mask is a binary mask, without phase shifting features.

As a result of the layout rule, regions in the phase shift mask may result in phase conflicts. Thus, the invention also includes applying an adjustment to one or more of the phase shift regions in the phase shift mask to correct for phase conflicts. The adjustment in one preferred embodiment comprises dividing a phase shift region having a first phase into a first phase shift region having the first phase in a second phase shift region having the second phase. An opaque feature is added to the phase shift mask between the first and second phase shift regions. The complementary mask includes a corresponding opaque feature preventing exposure of the features to be exposed using the first and second phase shift regions in the phase shift mask, and includes a cut-out over the opaque feature separating the first and second phase shift regions to expose any feature resulting from the phase difference between the first and second phase shift regions. In one embodiment, the unique structure which results from the adjustment is laid out in the first instance to prevent phase conflicts in the layout, and so may not be considered an "adjustment" to correct a phase conflict in the layout.

For example, phase conflicts can arise in the implementation of a pattern consisting of an intersection of an odd number of line segments. The odd number of line segments defines a plurality of corners at the intersection. In this case, phase shift regions are laid out adjacent the line segments on either side of the corner so they have the same phase, and preferably continuing around the corner in all of the plurality of corners, except one. In one excepted corner, a first phase shift region having the first phase is laid out adjacent the line segment on one side of the corner, and a second phase shift region having the second phase is laid out adjacent the line segment on the other side of the corner. An opaque feature is added between the first and second phase shift regions in the one corner. The complementary mask includes a corresponding opaque feature preventing exposure of the intersecting line segments left unexposed by the phase shift mask, and includes a cut-out over the opaque feature separating the first and second phase shift regions to expose any feature resulting from the phase difference in the one excepted corner between the first and second phase shift regions.

The selection of the one excepted corner having the cut-out feature in the structure that defines the intersection of an odd number of line segments is implemented in various embodiments according to design rules. In one design rule, the one excepted corner is the corner defining the largest angle less than 180 degrees. In another design rule, the one excepted corner is the corner which is the greatest distance away from an active region on the integrated circuit.

In one embodiment, the pattern to be implemented includes exposed regions and unexposed regions. Exposed regions between unexposed regions (i.e., spaces between lines or other structures) having less than a particular feature size are identified for assist features. The particular feature size used for identification of exposed regions between unexposed regions may or may not be the same as the feature size used for selection of unexposed regions (i.e., lines) to be implemented using phase shift masking. According to this aspect of the invention, the process includes laying out phase shift regions in the phase shift mask to assist definition of edges of the unexposed regions between exposed regions.

According to another aspect of the invention, the process includes adding sub-resolution assist features inside a particular phase shift region in the phase shift mask. The sub-resolution features comprise in various embodiments features inside and not contacting the perimeter of the particular phase shift region. In other embodiments, the sub-resolution features result in division of a phase shift region having a first phase into first and second phase shift regions having the same phase. An opaque feature between the first and second phase shift regions acts as a sub-resolution feature to improve the shape of the resulting exposed and unexposed regions.

The sub-resolution features do not "print" in the image being exposed, but affect the intensity profile at the wafer level, such as by improving contrast of the image and thereby improving process latitude, and changing the size of the printed image caused by the phase shift region in which the sub-resolution feature is laid out, such as for optical proximity correction OPC.

According to another aspect of the invention, the layout of phase shifting regions in an opaque field includes a step of simulating an intensity profile or other indication of the exposure pattern to be generated, and locating regions in the exposure pattern which are anomalous, such as by having higher intensity. Sub-resolution features are then added to the layout covering the anomalous regions in the exposure pattern.

The use of sub-resolution features within phase shift regions is applied uniquely for the formation of an array of closely spaced shapes, such as an array of capacitor plates used in dynamic random access memory designs.

An overall process for producing a layout file, or a photolithographic mask is provided that includes identifying features to be implemented using phase shifting, laying out phase shifting regions so as to prevent or minimize phase conflicts, applying sub-resolution assist features to the phase shift regions, and producing a layout file. Next, a complementary mask is laid out to complete definition of the exposure pattern so that features that are not implemented using the phase shift mask are interconnected with the features implemented by the phase shift mask.

A method for producing integrated circuits having improved small dimension structures includes applying a photo-sensitive material to a wafer, exposing the photo-sensitive material using the phase shift mask implemented as described above, exposing the photo-sensitive material using the complementary mask implemented as described above, and developing the photo-sensitive material. A next process step in the method for producing integrated circuits involves the removal of material underlying the photo-sensitive material according to the resulting pattern, or addition of material over the wafer according to the pattern resulting from the use of the phase shift and complementary masks. The resulting integrated circuit has improved, and more uniform line widths, and improved and more uniform spaces between structures on the device. In some embodiments, the resulting integrated circuit has intersecting lines defined with phase shift masks.

The invention results, therefore, in methods for producing mask layout files and photolithographic masks based on such layout files suitable for the implementation of complex designs extensively using phase shifting structures to define small dimension features. New manufacturing techniques and improved integrated circuits are therefore provided.

Other aspects and advantages of the present invention can be understood with review of the figures, the detailed description and the claims which follow.

BRIEF DESCRIPTION OF THE FIGURES

The patent or application file contains at least one drawing executed in color. Copies of this patent or patent application publication with color drawing(s) will be provided by the Office upon request and payment of the necessary fee.

DETAILED DESCRIPTION

Figure 1:
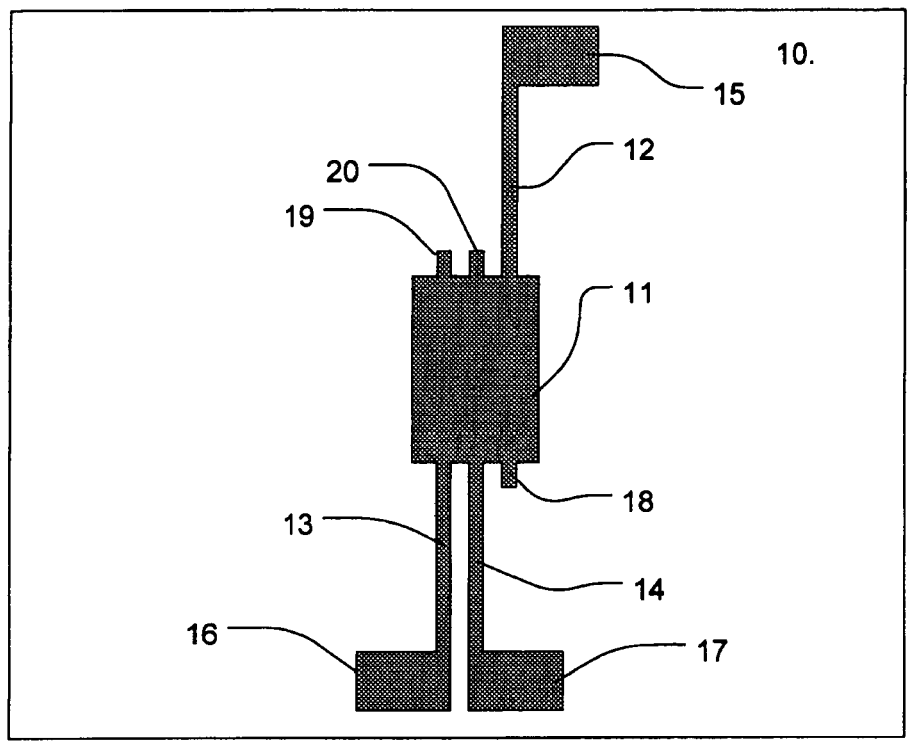
FIG. 1 illustrates a binary mask and FIG. 2 illustrates a phase shift mask according to a prior art phase shift masking technique.
Figure 2:
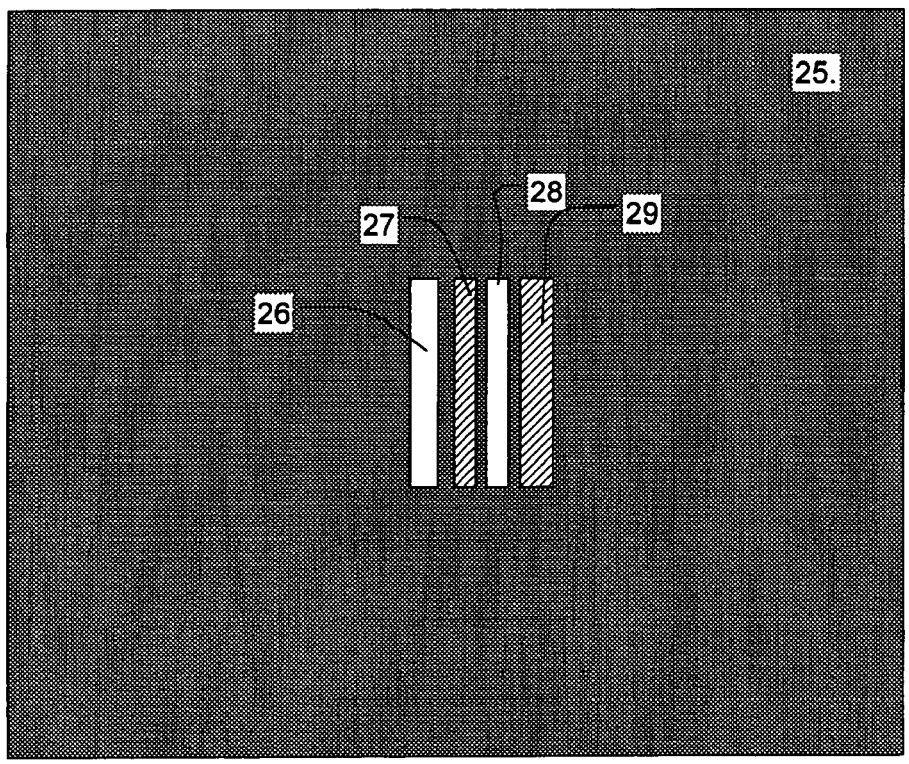
Figure 3:
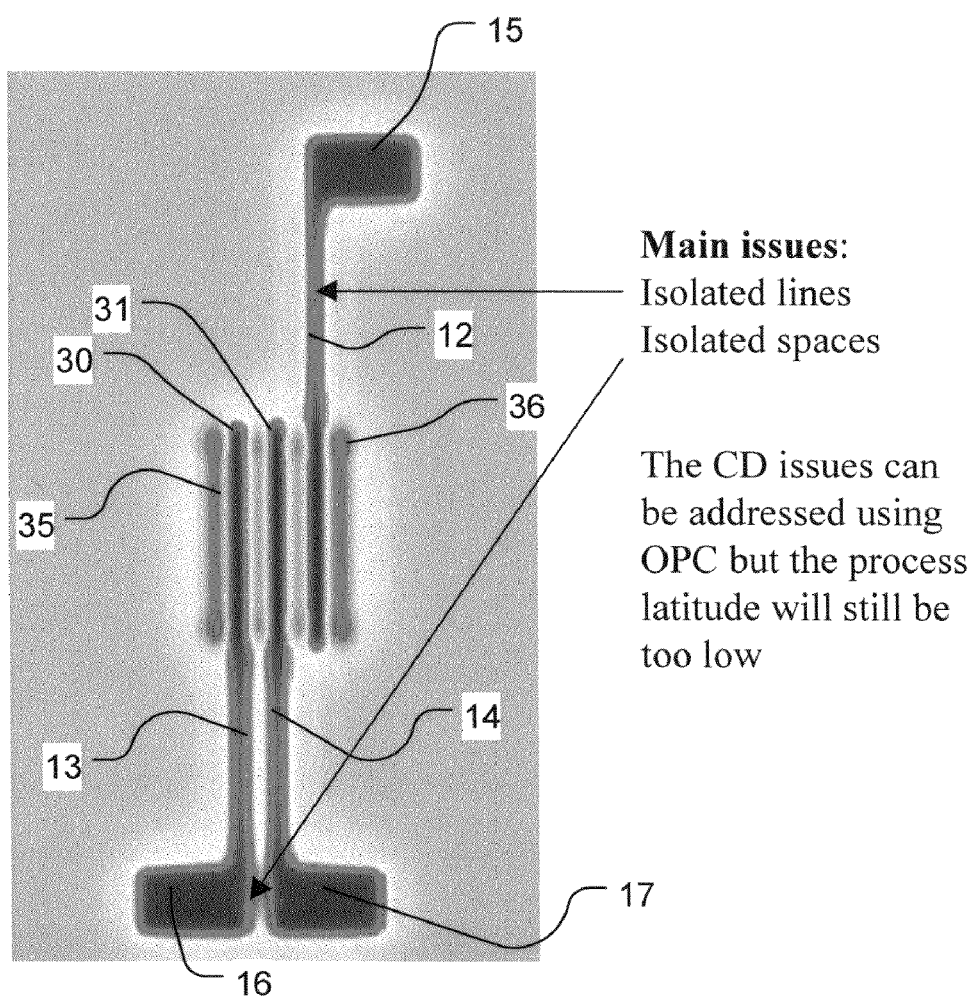
FIG. 3 is a plot of the intensity profile of an exposure made using the masks of FIGS. 1 and 2 according to the prior art.
Figure 4:
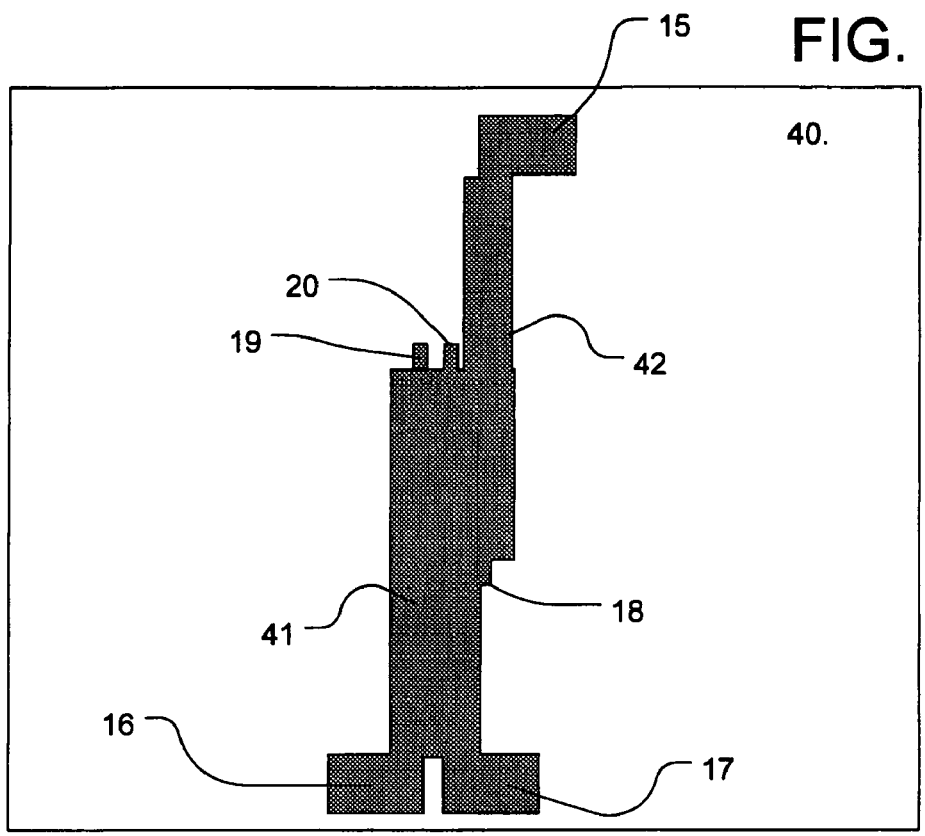
FIG. 4 illustrates a binary mask.
Figure 5:
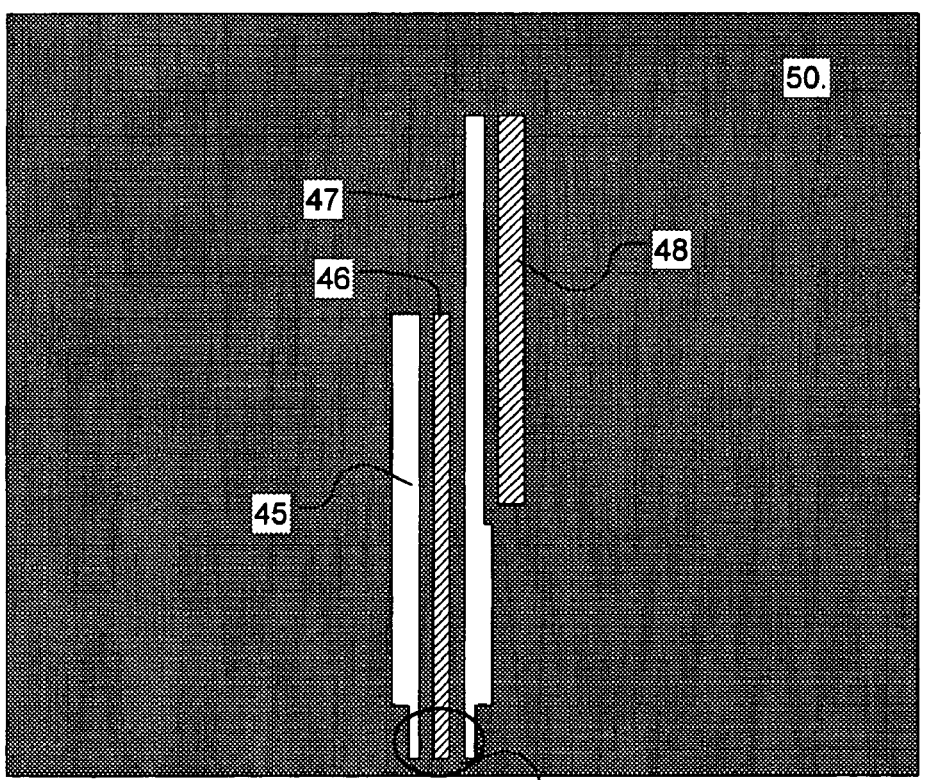
FIG. 5 illustrates a phase shift mask according to the present invention for implementing the same shape as implemented with FIGS. 1 and 2.
Figure 6:
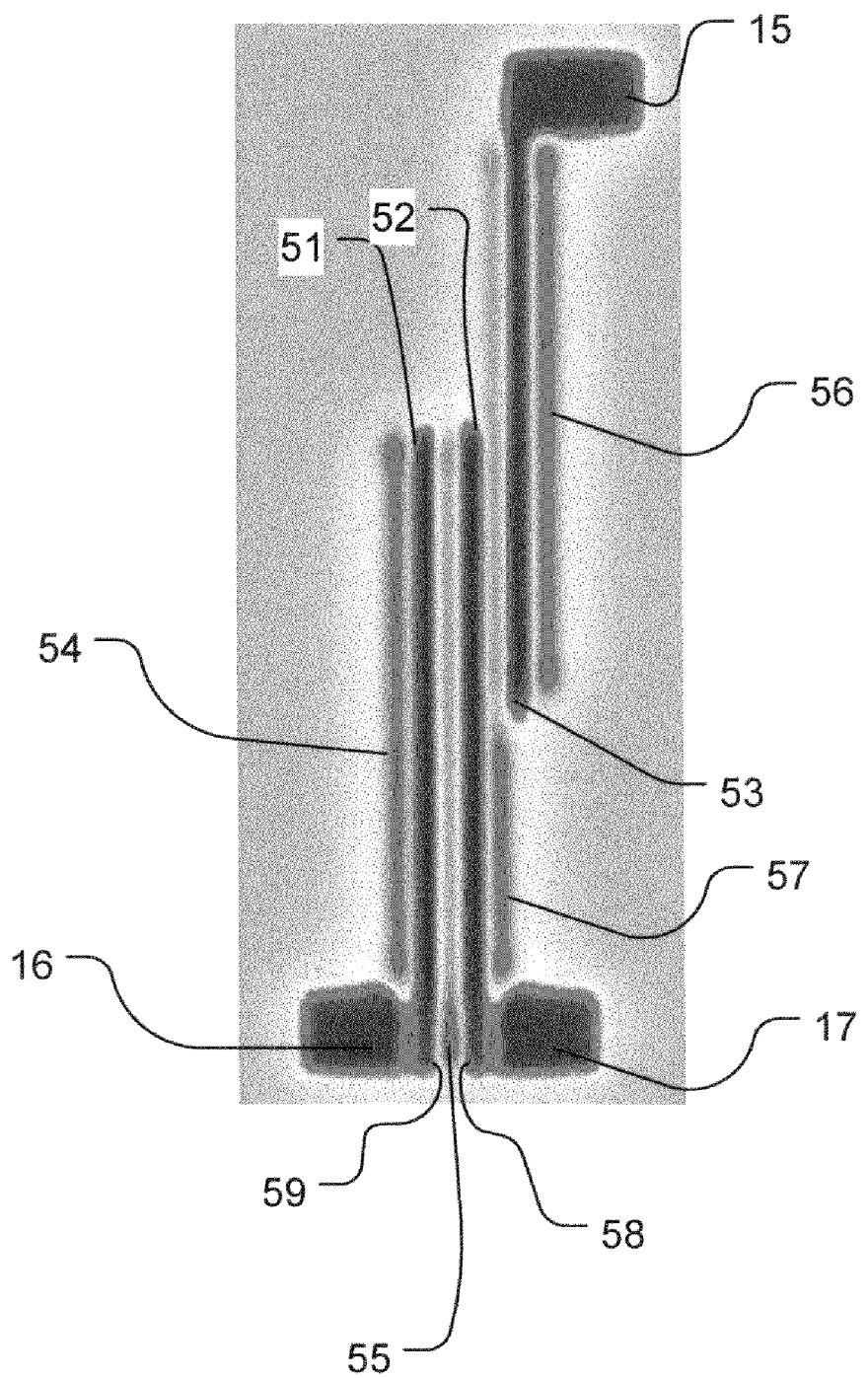
FIG. 6 is a plot of the intensity profile of an exposure made using the masks of FIGS. 4 and 5 according to the present invention.

A detailed description of the present invention is provided with respect FIGS. 1-18. FIGS. 1-3 illustrate problems associated with the layout and manufacturing of small dimension features according to the prior art. FIGS. 4-6 illustrate an approach to improving the layout and manufacturing of the small dimension features shown in FIGS. 1-3 according to the present invention. FIGS. 7-18 illustrate additional features and techniques.

FIG. 1 shows a binary mask for use in combination with an opaque field phase shift mask as shown in FIG. 2. The binary mask of FIG. 1 includes an opaque feature within a clear field 10. The opaque feature includes a blocking region 11 which corresponds to the features, i.e. transistor gates in an active region of a device, formed using the phase shift structures of FIG. 2. Narrow lines 12, 13 and 14 extend from the blocking region 11 to respective flag shaped elements 15, 16, 17. The narrow lines 12, 13, 14 in this example each extend through the blocking region 11, resulting in respective extension portions 18, 19, 20. The phase shift mask of FIG. 2 is formed within an opaque field 25, inside which zero degree phase shift regions 26, 27 and 180 degree phase shift regions 28, 29 are formed. The phase shift regions result in the printing of fine lines on the transitions between zero degree region 26 and 180 degree region 28, between 180 degree region 28 and zero degree region 27, and between zero degree region 27 and 180 degree region 29. These fine lines are coupled with the lines 12, 13, 14 in the binary mask of FIG. 1 for interconnection, while the blocking region 11 prevents exposure of the fine lines during the exposure using the binary mask.

FIG. 3 shows the resulting fine lines 30, 31, 32 in the active region of the layout. The long narrow lines 12, 13, 14 interconnect the fine lines 30, 31, 32 with the flag shaped features 15, 16, 17. In the Fig., the regions 35 and 36 do not print, but are higher intensity regions which show dark as artifacts of black and white printing of the color image generated using a simulation program.

Issues associated with this technique include the poor quality of the image of isolated lines, such as long line 12, and of the narrow spaces, such as between the flag shaped features 16 and 17. Classical optical proximity correction techniques can be applied to improve dimensional control of these images, however such processes according to the prior art do not improve process latitude, making the structures difficult to manufacture.

FIGS. 4 and 5 show the binary mask and phase shift mask implemented according to the present invention, extending phase shifting techniques to the more complex circuit pattern beyond the transistor gates in the active region. The binary mask of FIG. 4 is formed in a clear field 40. It includes blocking features 41 and 42. The pattern elements which are common with FIG. 1 have like numbers, so the extensions 18, 19, 20 and the flag shaped features 15, 16, 17 have the same reference numbers. A corresponding phase shift mask shown in FIG. 5 includes an opaque field 50. The phase shifting regions have been extended along the entire lengths of the lines excluding the extensions 18, 19, 20 in this example. In addition, phase shifting in the region 49 is used to assist the definition of the edges of the flag shaped regions 16 and 17 in the narrow space between them. Thus, zero degree phase shift regions 45 and 47 are formed, and 180 degree phase shift regions 46 and 48 are formed. The phase shift regions 45, 46 and 47 extend to the lower edges 51, 52 of the flag shaped regions 16, 17.

The portions of shifter 45 and shifter 47 extending in the area 49 are sub-resolution, meaning that they are small enough in comparison to the wavelength of the light used to expose the mask ($\lambda$), divided by the numerical aperture NA of the beam ($\lambda$/NA) to not leave a trace in the resist. Their size depends on $\lambda$/NA but also on the resist used and the way it is processed. These features are out of phase compared to the shifter 46 also extending in the area 49. Their purpose is to improve the aerial image of the printing feature 49. By adding some out-of-phase light at the edge of the feature 47, the tail of the intensity profile coming from feature 47 is partially removed, and the aerial image becomes sharper as can be seen on FIG. 6 compared to FIG. 3.

A simulation of an image resulting from application of the masks of FIGS. 4 and 5, is shown in FIG. 6, in which the regions 54, 55, 56 and 57 are nonprinting artifacts as mentioned above of the black and white printing of the color simulation image. The long lines corresponding to the lines 12, 13, 14 of FIG. 1 are printed entirely using phase shifting, so that quality, narrow dimension features 51, 52 and 53 result. The phase shifting assist feature between and on the edges of the flag shaped patterns 16, 17 results in better definition of the edges 58, 59 between the regions 16, 17. Thus, FIGS. 4-6 illustrate the application of phase shifting techniques to complex circuit pattern beyond the active regions of the device.

Figure 7:
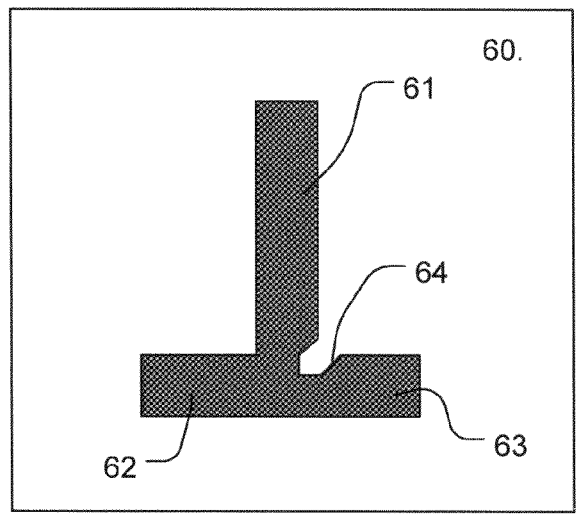
FIG. 7 is a binary mask.
Figure 8:
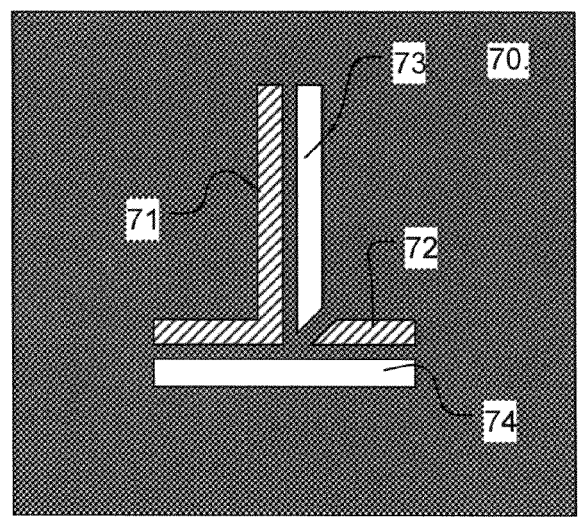
FIG. 8 is a phase shift mask for implementation of a feature comprising three intersecting line segments according to the present invention.
Figure 9:
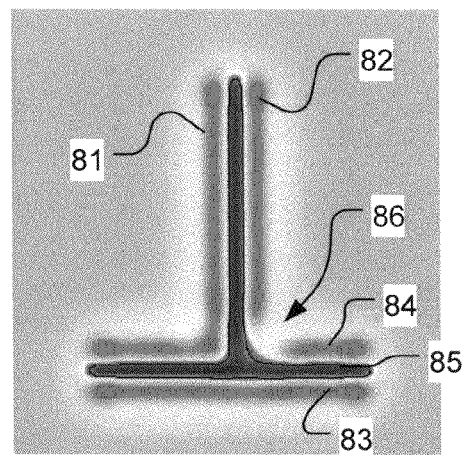
FIG. 9 is a plot of the intensity profile of an exposure made using the masks of FIGS. 7 and 8.

FIGS. 7, 8 and 9 illustrate a technique used for layout of complex structures comprising an odd number of intersecting line segments using phase shift masking. FIG. 7 shows a binary mask in a clear field 60 comprising an opaque feature 61 corresponding to a first of intersecting line segments, an opaque feature 62 corresponding to a second of the intersecting line segments, and an opaque feature 63 corresponding to a third of the intersecting line segments. A corner cut-out region 64 is formed according to present technique is described further below. FIG. 8 shows a phase shift mask in an opaque field 70 for formation of the intersecting line segments, and for use in combination with the complementary mask of FIG. 7. The phase shift mask includes 180 degree phase shift region 71, 180 degree phase shift region 72, zero degree phase shift region 73, and zero degree phase shift region 74. As can be seen, the 180 degree phase shift region 71 extends adjacent the line segments corresponding to the regions 61 and 62 and around the corner between regions 61 and 62. Also, the zero degree phase shift region 74 extends adjacent to line segments and 62 and 63 and through the "corner" formed by the 180 degree angle in the intersection two line segments. The phase shift regions 72 and 73 extend along the line segment 63 adjacent one side of the corner and along the other side 61 of the corner, respectively and have opposite phases. An opaque feature is laid out in the corner between the two phase shift regions 72 and 73. The cut-out feature 64 in the binary mask of FIG. 7 tends to expose the artifact which would be created by the phase transition in the corner between phase shift regions 72 and 73.

FIG. 9 shows the simulation of the image printed using the phase shift mask of FIG. 8, with a binary mask of FIG. 7. The features 81, 82, 83 and 84 are nonprinting artifacts of the simulation program. The "T" shaped feature 85 results from the phase shift masking technique with corner cutting. As can be seen, the narrow lines are formed with relatively uniform thickness and straight sides. In the corner 86 which corresponds to the cut-out feature 64 of FIG. 7, the feature 85 is slightly less sharp than in the other corners. The shape of the printed corner could be improved by applying some correction to the cut-out 64 and the shifters 72 and 73.

Figure 10:
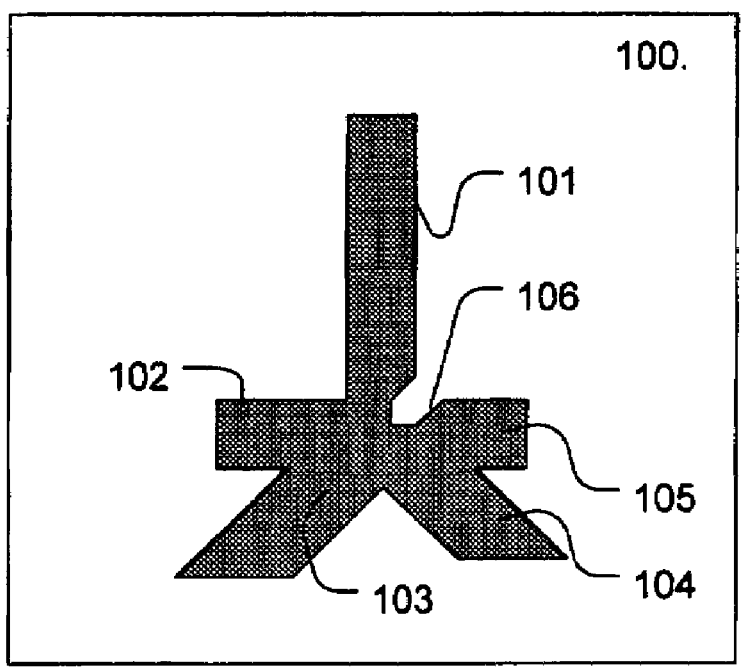
FIG. 10 is a binary mask.
Figure 11:
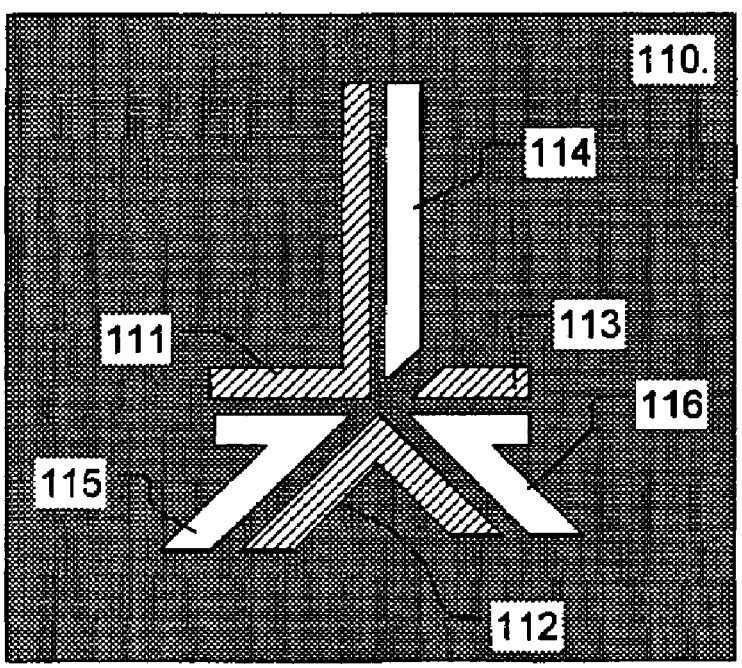
FIG. 11 is a phase shift mask for implementation of a feature comprising five intersecting line segments according to the present invention.

FIGS. 10 and 11 illustrates the "corner cutting" technique as applied to a structure comprising five intersecting line segments. Thus, FIG. 10 shows a binary mask 100 including an opaque feature having blocking structure 101 corresponding to a first line segment, blocking structure 102 corresponding to a second line segment, blocking structure 103 corresponding to a third line segment, blocking structure 104 corresponding to the fourth line segment, and blocking structure 105 corresponding to the fifth line segment. A corner cut-out feature 106 is formed between the line segments 101 and 105.

FIG. 11 shows the phase shift mask for use in combination with the binary mask of FIG. 10. The phase shift mask of FIG. 11 is formed in an opaque field 110. 180 degree phase shift regions 111, 112 and 113 are laid out in an alternating fashion as shown FIG. 11. Zero degree phase shift regions 114, 115 and 116 are laid out in a complementary fashion to define the five intersecting line segments. An opaque feature is formed between the phase shift regions 114 and 113. The artifact which would be created by the phase transition between the phase shift regions 113 and 114 is exposed by the cut-out 106 in the binary mask of FIG. 10. In addition, the shape of the opaque feature in the phase shift mask between the phase shift regions 113 the shape of the art-out 106 can also be optimized and 114 can be modified using optical proximity correction techniques to improve that resulting image. The shape of the cut-out 106 can also be optimized.

A structure and a process for controlling phase mismatches on inside corners of complex structures is provided. Inside corner cut-outs are formed on the binary masks to block artifacts of phase transition in the corner, and phase shift regions are adjusted by dividing them into first and second phase shift regions of opposite phase, and reshaping them on inside corners to accommodate and optimize the effects of the inside corner extensions. The corners at which the extensions are applied can be simply decided by applying them to all inside corners, when shapes of the corners are not critical. Alternatively, the corner extensions can be applied only in one corner of a structure having an odd number of intersecting segments, such as one corner corresponding to a region in the layer characterized by greater process latitude than other corners. The corner is picked, for example, by selecting an inside corner having the greatest distance from an active area on the device, or an inside corner having a largest angle less than 180 degrees.

The selection of corners for the phase mismatch extensions may affect the assignment of zero and 180 degree phase shift regions. Thus it may be desirable to select the corners for inside corner extensions prior to "coloring" the layout with phase assignments. A first approach to avoiding the corner conflicts is simply to select the phase shift areas in a manner that does not cause a conflict. Of course this is not always possible. Next, the conflicts can be left in regions on the chip where the design rules will tolerate the artifacts caused by the phase mismatch, or in other words, in regions characterized by greater process latitude than the alternative locations, in the exposure patterns that result from the corner cut. In one example process, the corner extensions are applied on all inside corners, then the layout is colored to assigned phases, and then corners are rebuilt with optimized shapes. Alternatively, simplified phase assignment can be utilized when all corners are provided with phase mismatch extensions.

Figure 12:
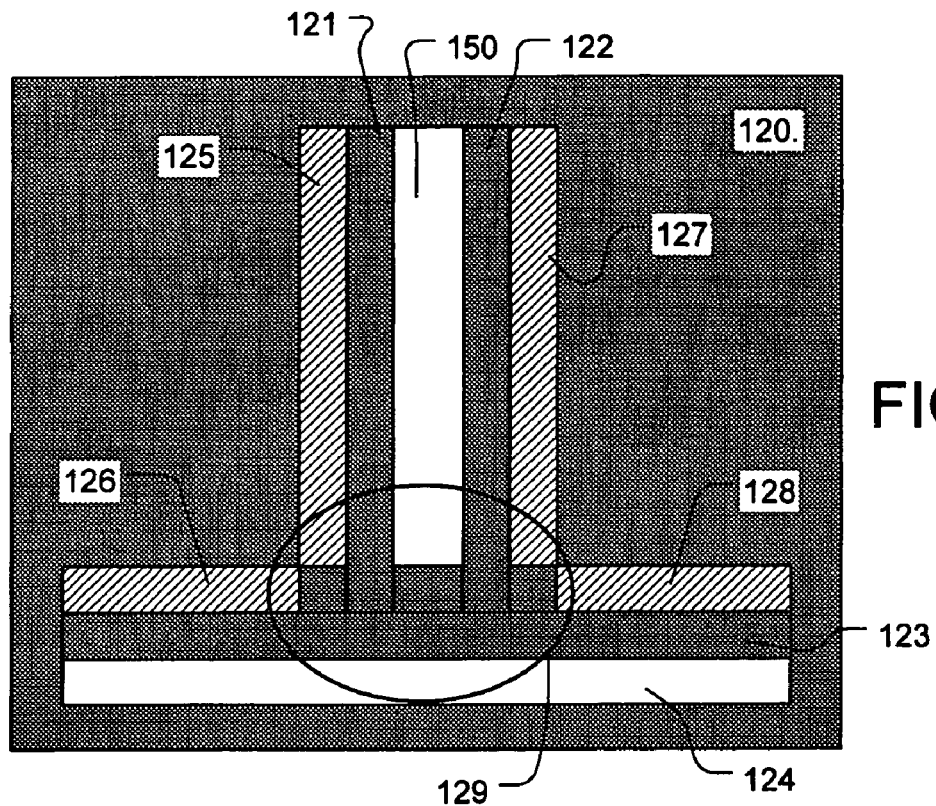
FIG. 12 illustrates a phase shift mask for implementation of a double "T" structure.
Figure 13:
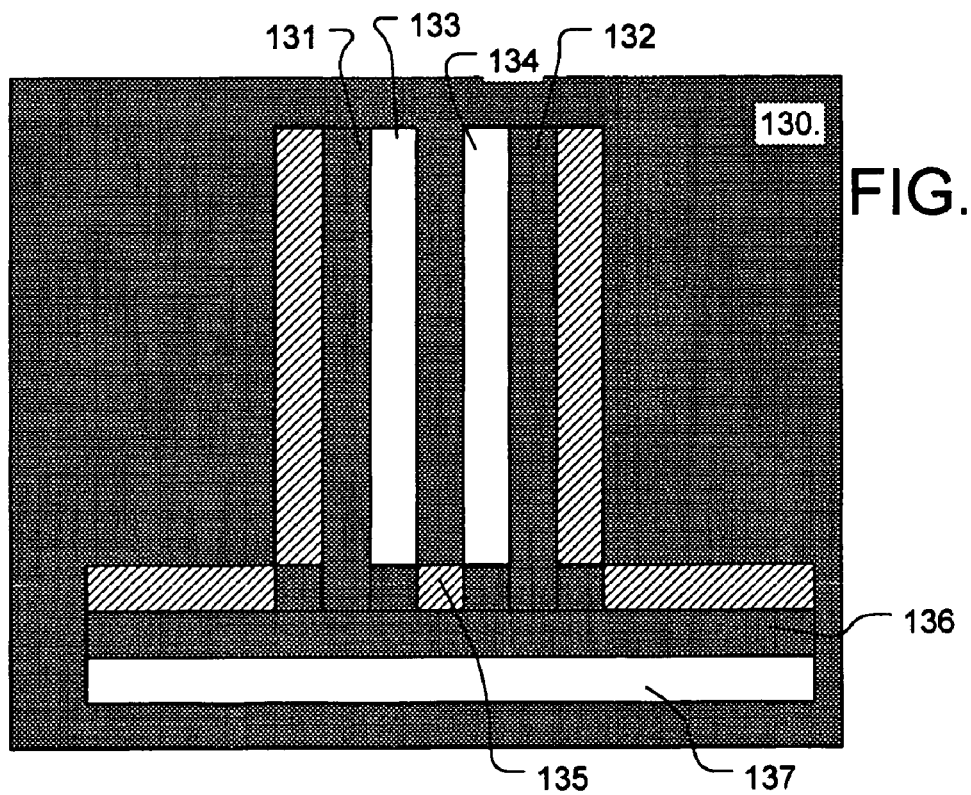
FIG. 13 illustrates an alternative phase shift mask for implementation of a double "T" structure according to the present invention.

FIGS. 12 and 13 illustrate problems encountered in the layout of a so-called double "T" structure. In FIG. 12, a phase shift mask in an opaque field 120 is shown for forming a double "T" structure having vertical line segments 121 and 122 intersecting with horizontal line segment 123. Vertical line segments 121 and 122 are close together, so a single phase shift region 123 is formed between them. In this case, phase shift region 123 is a zero degree phase shift region. Phase shift region 124 beneath the line segment 123 is also a zero degrees phase shift region creating a phase conflict in the region 129 between the vertical line segments 121 and 122. 180 degree phase shift regions 125, 126, 127 and 128 are formed along the line segments in the corners as shown. The shapes of regions 125, 126, 127, 128 have not been optimized in the corner in this example. The phase shift regions do not extend to all the way to the intersection of the line segments in this example. The phase mismatch in the region 129 can result in an aberration image such that the quality of the line segments in that region is reduced. The assumption is that the distance between 121 and 122 is small enough that the printing of the region 129 will not be critical.

FIG. 13 illustrates a double "T" structure with vertical line segments 131 and 132 formed in an opaque field 130. In this case, separate phase shift regions 133 and 134 are formed between the vertical line segments 131 and 132. A 180 degree phase shift region 135 is formed between them along the horizontal line segment 136. This resolves the phase mismatch which would have occurred with the zero degrees phase shift region 137 according to the structure of FIG. 12, and allows for higher quality printing of the images. In this case, the corner cutting technique utilizes simple square shaped opaque features in the corners, rather than the diagonal shape shown in FIGS. 8 and 11. The square shape of FIGS. 12 and 13 may be simpler to implement using a layout program in a processor with more limited power.

Figure 14:
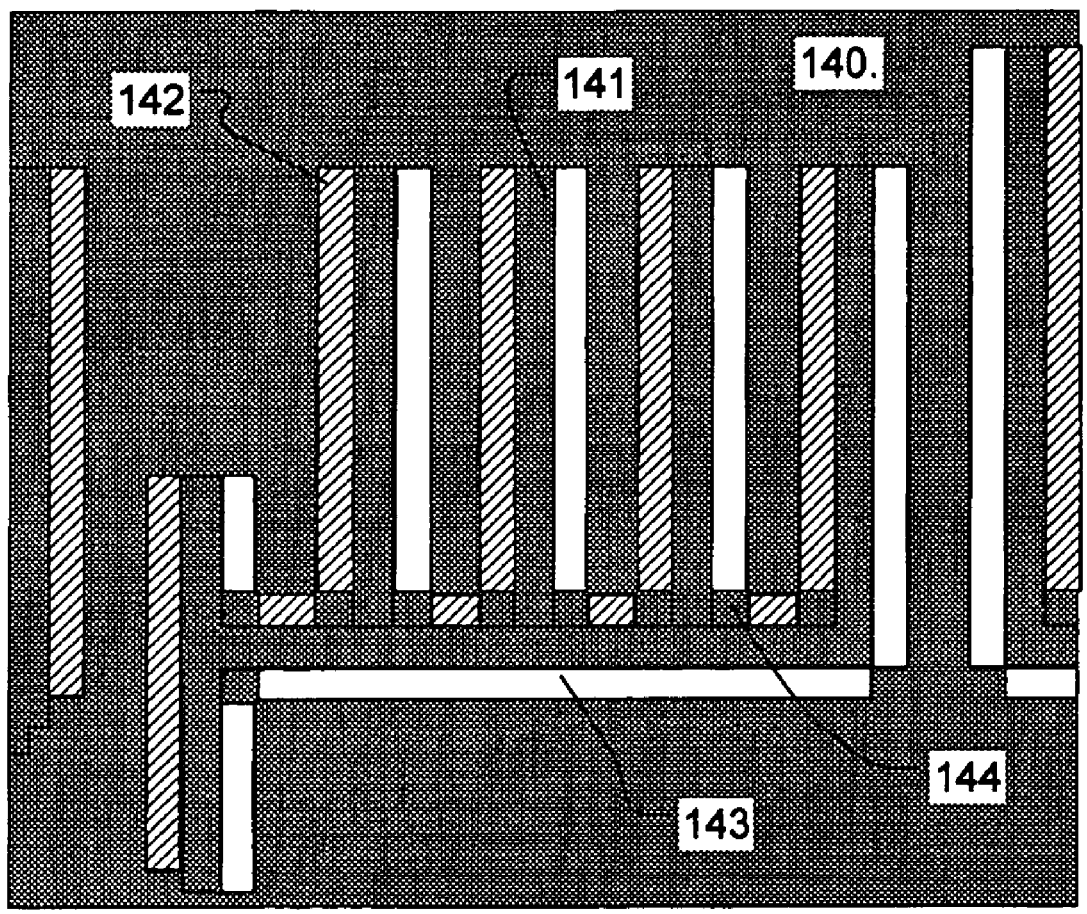
FIG. 14 illustrates one example of the layout of a phase shift mask according to the present invention for a complex pattern.

FIG. 14 provides a close-up of a portion of the layout of a phase shift mask in an opaque field for a layer of an integrated circuit structure. As can be seen, a comb shaped structure 141 is formed with zero degree phase shift regions (hatched, e.g. region 142) generally on the upper and left and 180 degree regions (clear, e.g. region 143) generally on the lower and right. All inside corners are blocked with square opaque features (e.g. feature 144) in this example to minimize phase conflicts.

The generation of phase shift masks for a complex structure is a nontrivial processing problem. Automatic assignment of phase shift regions, and addition of optical proximity correction features and corner features for preventing phase shift mismatches as described above are provided in this example to facilitate processing. Three stages in the generation of phase shift mask layouts according to the process which is implemented using a design rule checking programming language (e.g. Vampire (™) Design Rule Checker provided by Cadence Design Systems, Inc.) as follows:

Definition of the input layers:
L13=layer(13 type(0))
L13 is the original poly layer
L12=layer(11 type(0))
L12 is the original poly layer shifted in the x and y direction by 0.02 micron Generation of the output layers:
L2=geomSize(L13−0.01 edges)
size L13 by −0.01 only edges (inner corners are not moved)
L2_1=geomAndNot(L13 L2)
L2_2=geomSize(L2_1 0.01)
L3=geomAndNot(L2_2 L13)
marker: 0.01 by 0.01 square in inner corners of L13
L4=geomSize(L13 0.01)
L5=geomSize(L13 0.01 edges)
size L13 by 0.01 only edges (outer corners are not moved)
L5_1=geomAndNot(L4 L5)
L6=geomAndNot(L5_1 L13)
marker: 0.01 by 0.01 square at the tips of outer corners
L6_1=geomSize(L6 0.14)
L6_2=geomSize(L13 0.15 edges)
L6_3=geomAndNot(L6_1 L6_2)
L6_4=geomSize(L6_3 0.14)
L6_5=geomSize(L6_4−0.14)
merges any 0.28 and below gaps
L6_6=geomSize(L6_5−0.02)
L6_7=geomSize(L6_6 0.02)
removes any 0.04 and below geometries
L7=geomAndNot(L6_7 L13)
L7=layer to be removed from phase layer to cut the outer corners
L3_1=geomSize(L3 0.15)
L8=geomAndNot(L3_1 L13)
L8=layer to be removed from phase layer to cut the inner corners
L8_1=geomOr(L7 L8)
add together the layers to be removed from the phase layer
L8_2=geomSize(L13−0.1)
L8_3=geomSize(L8_2 0.1)
removes any 0.2 micron and below geometries
L8_4=geomAndNot(L13 L8_3)
L13 without geometries larger than 0.2 micron
L9=geomSize(L8_4 0.15)
L9_1=geomAndNot(L9 L8_1)
L9_2=geomAndNot(L9_1 L13)
L9_3=geomSize(L9_2−0.03)
L10=geomSize(L9_3 0.03)
−0.03/0.03 to remove any geometry below 0.06 micron
L10=phase shifter layer (no coloring performed)
L11=geomOverlap(L10 L12)
0 degree phase-shift layer
L14=geomAndNot(L10 L11)
180 degree phase-shift layer A design rule checker can be utilized to identify all exposed features (i.e. lines) and unexposed features (i.e. spaces between lines) of an input layout that have a size less than a minimum feature dimension. Features subject of the minimum feature dimension may constitute structures or spaces between structures. Different minimum feature dimensions are applied to lines and to spaces in one embodiment. Thus, minimum feature structures can be identified by subtracting slightly more than ½ of a minimum feature dimension for lines from the original size of an input structure. This results in eliminating all structures which have a dimension less than the minimum dimension. The remaining structures can then be reconstituted by adding slightly more than ½ of the minimum dimension back. Minimum dimension structures can then be identified by taking the original input structure and subtracting all structures which result from the reconstitution step. This process can be characterized as performing a size down operation to eliminate small dimension features followed by a size up operation on remaining edges to produce a calculated layout. The small dimension features are then identified performing an "AND NOT" operation between the original layout AND NOT and the calculated layout.

Narrow spaces can be identified by an opposite process. In particular, slightly more than ½ of the minimum feature dimension for spaces is added to the original size of the structure. This added length or width causes structures that are close together to overlap and merge. Next, the remaining structures are reconstituted by subtracting slightly more than ½ of the minimum feature dimension from the sides of structures remaining. Narrow regions are identified by taking the reconstituted remaining structures and subtracting all original structures. Thus, a process can be characterized as performing a size up operation to eliminate small dimension spaces, followed by a size down operation on the remaining edges to produce a calculated layout. The small dimension spaces are then identified by performing an "AND NOT" operation between the calculated layout and the original layout.

The next step in the procedure for automatic generation of phase shift mask layouts involves identifying all corners in the structure. Inside corners and outside corners are identified. Outside corners are blocked to define ends of phase shift regions. Inside corners may result in a phase mismatches discussed above. Inside corners are blocked, and thus provided with an extension of the opaque region, such as a square extension, and a shortening of the phase shift regions so that they do not extend all the way to the inside corner. This square extension is applied in all inside corners, whether a phase mismatch is found or not. Alternatively, the extension is applied only where phase mismatches occur.

Phase shift regions are formed in a simple case, by copying the input structures in the minimum dimension features, and shifting up and to the left for 180 degree (or zero degree) shifters, and down and to the right for zero degree (or 180 degree) shifters. The blocking regions formed for the outside corners cut the shifted regions at the ends of the input structures, and the blocking structures formed on the inside corners cut the shifted regions at the inside corners of the structure to provide well formed phase shift mask definitions. The phase "coloring" can be applied to the resulting phase shift regions in other ways, including manually, so that the zero and 180 degree regions are properly laid out.

The limitation of this simple technique is that the shifts in the X and Y directions need to be carefully chosen if there is any polygon at an angle different from 0 to 90°.

All inside corners are blocked in the example shown in FIG. 14. However, in a preferred system, inside corners for which no phase conflict is encountered would be filled with a phase shift region.

In another embodiment, the inside corner extensions which block phase mismatches, are not applied on inside corners adjacent active regions of devices that are near the corners, if a choice is possible. For structures having an odd number of segments intersecting, the location of the phase mismatch, and application of the corner extension, can be chosen at the angle farthest from the active regions in the device, or at the largest angle.

Once the inside corner extensions are identified, the extensions can be optimally shaped to improve the resulting exposure pattern, such as by changing the squares to diagonally shaped regions shown in FIGS. 8 and 11. Other principles of optical proximity correction can be applied to enhance the shapes of the inside corner extensions. Likewise, the phase shift regions can be shaped adjacent the inside corners to enhance performance. In one example system transitions may be enhanced between the phase shift regions by placing a 90 degree phase shift region between conflicting zero and 180 degree phase shift regions.

Figure 15A:
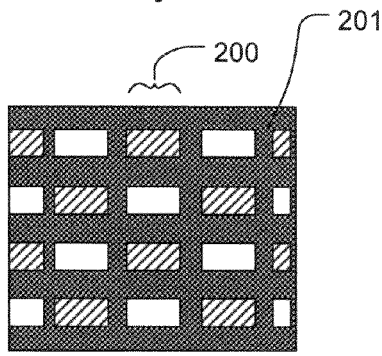
FIGS. 15A and 15B illustrate the layout, a simulation, and contour plots of a prior art phase shift mask for implementation of a dense array of capacitor plates on integrated circuit.
Figure 15B:
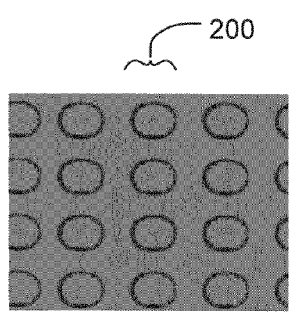

FIGS. 15A and 15B illustrate a prior art technique for laying out an array of dense shapes, such as a capacitor plate array in the layout of a dynamic random access memory device. A phase shift mask as shown in FIG. 15A is used to form the array. The phase shift mask includes a column 200 of alternating phase transparent areas within an opaque field 201. Likewise adjacent columns alternate in phase in a complementary manner as shown. This results in the printing of lines on transitions between the alternating phase shift areas and exposing regions inside the phase shift regions. FIG. 15B illustrates the simulation of the exposure pattern. As can be seen, a dense array of oval patterns is caused by the layout of FIG. 15A. For a denser array, it is desirable to make the exposed patterns more rectangular in shape.

Figure 16A:
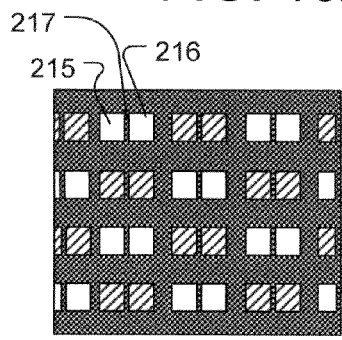
FIGS. 16A and 16B illustrate the layout, a simulation, and contour plots of the phase shift mask for implementation of a dense array of capacitor plates on an integrated circuit according to the present invention.
Figure 16B:
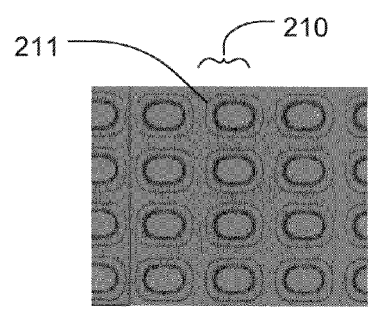

FIG. 16A illustrates an adjustment to the phase shift layout according to the present invention to make the exposed patterns more rectangular. According to this technique, the phase shift regions have been adjusted so that they consist of a first phase shift area 215 and a second phase shift area 216 having the same phase with an opaque sub-resolution feature 217 in between. Likewise, all of the phase shift regions have been split into two phase shift regions as shown with sub-resolution features in between. Note that the assist feature which divides the phase shift region is not necessarily smaller than the phase shift region. Lines are printed at the phase transitions, and the sub-resolution features between the like-phase regions do not print. The resulting pattern is shown in FIG. 16B, where the exposure shows features having much straighter sides and covering much greater area than those of FIG. 15B. In the simulation plot of FIG. 16B, the dark outlines, such as line 211, illustrate the final contour of the exposed region. Thus, a technique for improving the images which result from use of phase shift areas involves adjusting a phase shift area having a particular phase into a first phase shift area and a second phase shift area having the same particular phase and adding a sub-resolution feature in between.

Figure 17A:
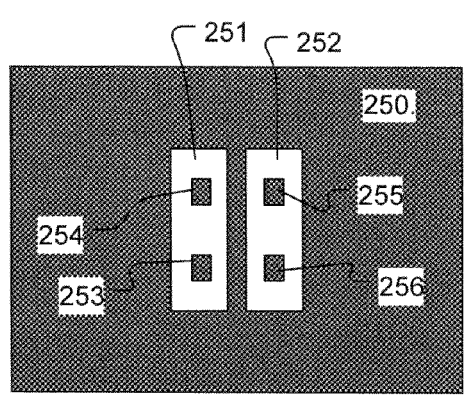
FIG. 17A illustrates a phase shift mask having sub-resolution assist features, for implementation of a exposure pattern as shown in FIG. 17B.
Figure 17B:
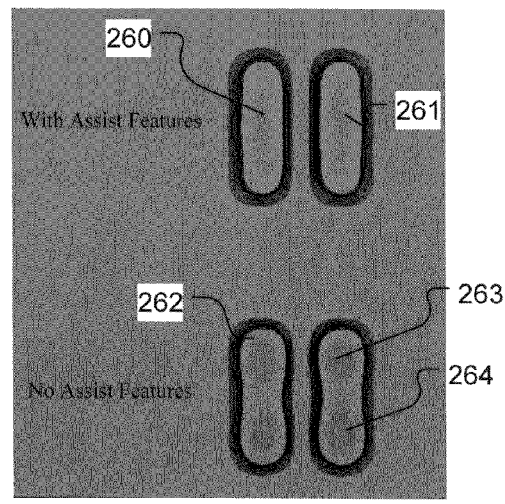
FIG. 17B shows an exposure pattern which results from the phase shift mask of FIG. 17A, and an exposure pattern which would result from the phase shift mask of FIG. 17A without the assist features.

FIGS. 17A and 17B illustrate the use of sub-resolution features within the phase shift regions according to another technique of the present invention. In FIG. 17A, an opaque field 250 is shown with a first phase shift region 251 and a second phase shift region 252 having an opposite phase. Sub-resolution assist features 253 and 254 are formed within the phase shift region 251. Sub-resolution assist features 255 and 256 are formed within the phase shift region 252. As can be seen, the phase shift regions 251 and 252 have respective perimeters. The sub-resolution features 253, 254, 255, 256 are inside of the phase shift regions and do not contact the perimeters in this example.

FIG. 17B shows simulation of the exposure patterns resulting from the phase shift mask of FIG. 17A. In the top, images 260 and 261 are shown which correspond to the use of the phase shift mask of FIG. 17A. Images 262 and 263 correspond to the use of the phase shift mask of FIG. 17A without the sub-resolution assist features 253-256. As can be seen, with the sub-resolution assist features 253-256, the lines are much straighter and the exposure patterns are much more uniform. According to one technique, the sub-resolution features are placed within the phase shift regions by first simulating the exposure patterns without the sub-resolution assist features. Hot spots, such as hot spot 264 in the simulation image 263 or other anomalies, are identified. Sub-resolution features are then placed over the anomalies. Thus, sub-resolution feature 255 corresponds to the hot spot 264.

Figure 18:
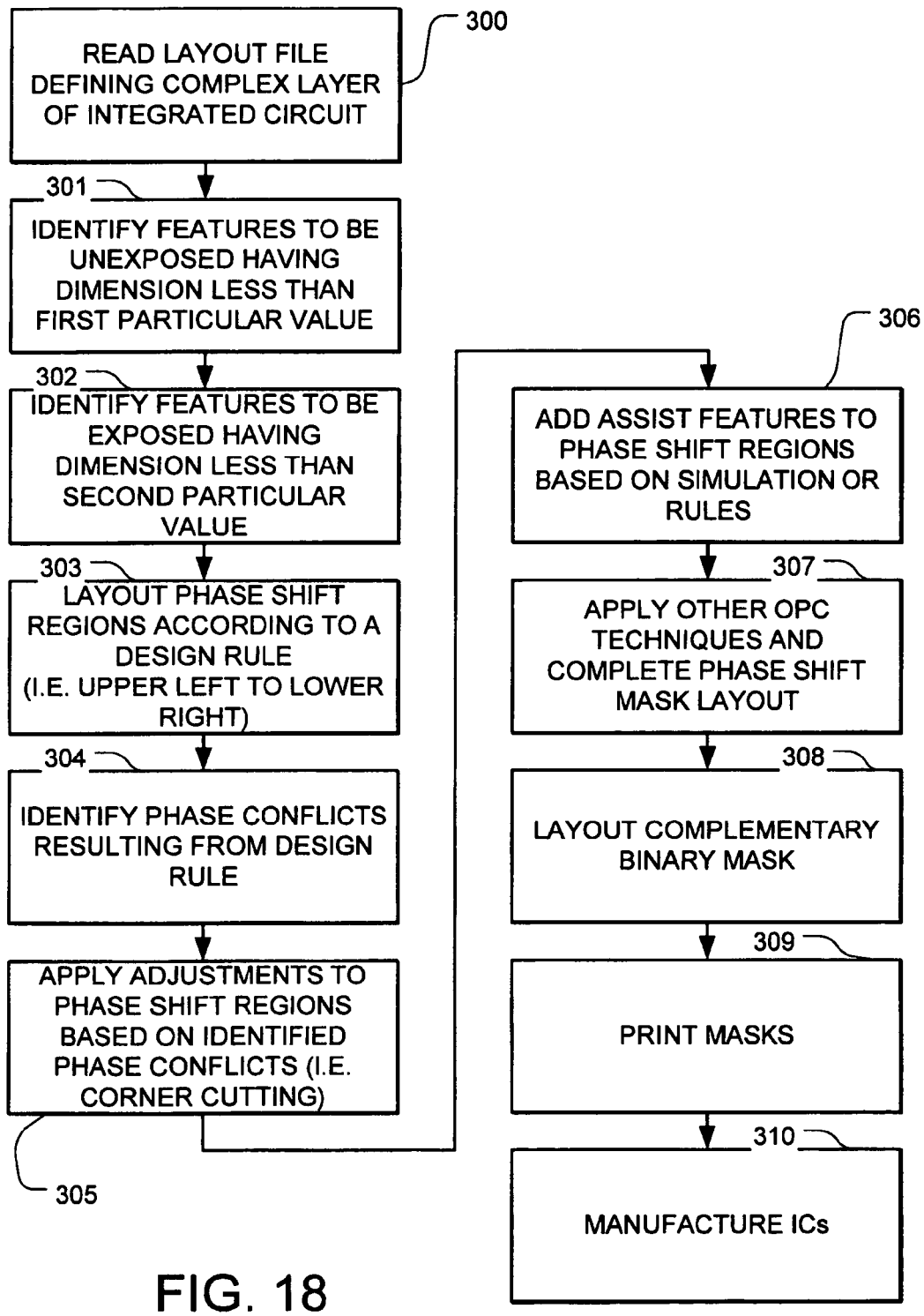
FIG. 18 is a flow chart of a process for producing layout files, and phase shift mask and manufacturing integrated circuits according to the present invention.

The techniques for improving phase shift masking for complex layouts outlined above are combined into a process for producing phase shift layout data and manufacturing phase shift masks for complex layouts, as shown in FIG. 18. The process is also extended to the manufacturing of integrated circuits with improved structures. Thus, according to the present invention, the manufacturing process involves reading a layout file which defines a complex layer of an integrated circuit (step 300). For example, in one embodiment the layer comprises polysilicon or another conductive material used as transition gates and interconnect structures. Next, features to be left unexposed by the mask are identified which have a dimension less than a first particular value (step 301). Then, features to be exposed and having a dimension less the second particular value are identified (step 302). The first and second particular values may be the same value or different, as suits the particular implementation.

Next, the process involves laying out phase shift regions for the identified features according to a design rule (step 303). One example design rule involves laying out phase shift regions having a zero degree phase (or 180 degree phase) to the upper left, and a phase shift regions having the opposite phase, such as 180 degree phase (or zero degree phase) to lower right. This simple phase shift layout rule results in phase conflicts, where adjacent phase shift regions have the same phase so phase transitions do not occur. Any other phase assignment technique can be used. The phase conflicts are identified in a next step (step 304). Adjustments are applied to the phase shift regions based on identified phase conflicts (step 305). For example, the corner cutting technique described with respect to FIGS. 7-11 is applied. In a next step, the exposure pattern is simulated and assist features are added to the phase shift regions based on the simulation (step 306). Rather than using simulation for placement of sub-resolution assist features, the locations of the sub-resolution features can be determined based on design rules. For example, one design rule is to place a 0.1 μm square assist feature, 0.2 μm away from the edge of the phase shift region. Thus, phase shift regions may be adjusted using sub-resolution assist features within the perimeter of the phase shift region, or by dividing the phase shift region as described with reference to FIGS. 16A and 17A.

In a next step, other optical proximity correction techniques are applied and the phase shift mask layout is completed (step 307). A complementary mask is then laid out, including the corner cut-outs as necessary for intersecting line segments and the like (step 308).

With the completed phase shift and complementary mask layouts, the masks are printed using techniques known in the art (step 309). See, U.S. Pat. Nos. 6,096,458; 6,057,063; 5,246,800; 5,472,814; and 5,702,847, which provide background material for phase shift mask manufacturing. Finally, integrated circuits are manufactured using the resulting phase shift masks (step 310).

Overall, the embodiments described provide a solution for applying phase shift masks extensively in integrated circuit layouts. This provides for shrinking entire layouts or significant portions of layouts. The process involves first identifying features using a computer program to define any features that have a dimension which is smaller than a specified minimum dimension. Also, the process is applied to identify spaces between features which are smaller than a minimum dimension. The minimum dimension for spacing may be different than the minimum dimension for structures. After detection of features smaller than a minimum dimension, phase shift regions are assigned. Non-printing phase shift regions can be used for providing greater contrast in narrow isolated spaces. Inside corner extensions to block phase conflicts are added where necessary. Complementary trim masks are generated using established techniques. Finally, optical proximity correction modeling is used to optimize the shapes being implemented.

Embodiments of the invention also provides techniques for applying phase shifting to specific shapes, such as "T" shapes, "Y" shapes, "U" shapes and "double T" shapes.

Optical proximity correction can be applied to the resulting phase shifted layouts. Serifs can be added to corners, line sizes can be adjusted, hammer heads can be added, phase shift areas can be sized, and assist opaque bars may be added to phase shift areas, using optical proximity correction modeling techniques.

The foregoing description of various embodiments of the invention have been presented for purposes of illustration and description. The description is not intended to limit the invention to the precise forms disclosed. Many modifications and equivalent arrangements will be apparent to people skilled in the art.

What is claimed is:

1. A method of phase shifting photolithography, comprising:
   identifying a pattern for a layer to be formed using photolithographic masking, the pattern including at least a first feature having a first edge; and
   laying out phase shift regions for the identified pattern to produce a phase shift mask, the phase shift mask having a first set of phase shift regions having a first phase, and a second set of phase shift regions having a second phase, said first set of phase shift regions and said second set of phase shift regions assisting definition of only a portion of the first feature, the portion of the first feature including only the first edge of the first feature.

2. The method of claim 1, further comprising:
   laying out a complementary mask having opaque and clear regions defining at least the first feature.

3. The method of claim 1, wherein the first feature is flag shaped.

4. The method of claim 1, wherein said identified pattern further includes a second feature having a second edge, the first edge of the first feature and the second edge of the second feature separated by a space, the space having a dimension less than a particular feature size, and
   wherein said second set of phase shift regions assist definition of only a portion of the second feature, the portion including only the second edge of the second feature.

5. The method of claim 1, wherein said identified pattern further includes a second feature having a second edge, the first edge of the first feature and the second edge of the second feature separated by a space, the space having a dimension less than a particular feature size, and
   wherein said second set of phase shift regions assist definition of only a portion of the second feature, the portion including only the second edge of the second feature, and the method further comprises laying out a complementary mask having opaque and clear regions defining at least the first feature and the second feature.

6. The method of claim 1, wherein said identified pattern further includes a second feature having a second edge, the first edge of the first feature and the second edge of the second feature separated by a space, the space having a dimension less than a particular feature size, and
   wherein said second set of phase shift regions assist definition of only a portion of the second feature, the portion including only the second edge of the second feature, and wherein the first and second features are flag shaped.

7. The method of claim 1, wherein the identified pattern includes a plurality of features having a dimension smaller than a second particular feature size, and
   wherein the phase shift mask defines the dimension of the plurality of features smaller than the second particular feature size.

8. The method of claim 1, wherein the identified pattern includes a plurality of features having a dimension smaller than a second particular feature size, and
   wherein the phase shift mask defines the dimension of the plurality of features smaller than the second particular feature size, and the method further comprises:
   laying out a complementary mask having opaque and clear regions preventing exposure of at least the plurality of features.

9. A photolithographic apparatus for forming a pattern for a layer including at least a first feature having a first edge, comprising:
   a phase shift mask including phase shift regions to produce the pattern, including a first set of phase shift regions having a first phase, and a second set of phase shift regions having a second phase, said first set of phase shift regions and said second set of phase shift regions assisting definition of only a portion of the first feature, the portion of the first feature including only the first edge of the first feature.

10. The apparatus of claim 9, further comprising:
a complementary mask having opaque and clear regions defining at least the first feature.

11. The apparatus of claim 9, wherein the first feature is flag shaped.

12. The apparatus of claim 9, wherein said pattern further includes a second feature having a second edge, the first edge of the first feature and the second edge of the second feature separated by a space, the space having a dimension less than a particular feature size, and wherein said second set of phase shift regions assist definition of only a portion of the second feature, the portion including only the second edge of the second feature.

13. The apparatus of claim 9, wherein said pattern further includes a second feature having a second edge, the first edge of the first feature and the second edge of the second feature separated by a space, the space having a dimension less than a particular feature size, and wherein said second set of phase shift regions assist definition of only a portion of the second feature, the portion including only the second edge of the second feature, and the apparatus further comprises:
a complementary mask having opaque and clear regions defining at least the first feature and the second feature.

14. The apparatus of claim 9, wherein said pattern further includes a second feature having a second edge, the first edge of the first feature and the second edge of the second feature separated by a space, the space having a dimension less than a particular feature size, and wherein said second set of phase shift regions assist definition of only a portion of the second feature, the portion including only the second edge of the second feature, and
wherein the first and second features are flag shaped.

15. The apparatus of claim 9, wherein the pattern includes a plurality of features having a dimension smaller than a second particular feature size, and wherein the phase shift mask defines the dimension of the plurality of features smaller than the second particular feature size.

16. The apparatus of claim 9, wherein the pattern includes a plurality of features having a dimension smaller than a second particular feature size, and wherein the phase shift mask defines the dimension of the plurality of features smaller than the second particular feature size, and the apparatus further comprises:
a complementary mask having opaque and clear regions preventing exposure of at least the plurality of features.

17. A computer readable medium storing instructions for laying out a photolithographic mask for a pattern for a layer including at least a first feature having a first edge, the instructions comprising:
laying out phase shift regions for the identified pattern to produce a phase shift mask, the phase shift mask having a first set of phase shift regions having a first phase, and a second set of phase shift regions having a second phase, said first set of phase shift regions and said second set of phase shift regions assisting definition of only a portion of the first feature, the portion of the first feature including only the first edge of the first feature.

18. The medium of claim 17, the instructions further comprising:
laying out a complementary mask having opaque and clear regions defining at least the first feature.

19. The medium of claim 17, wherein the first feature is flag shaped.

20. The medium of claim 17, wherein said identified pattern further includes a second feature having a second edge, the first edge of the first feature and the second edge of the second feature separated by a space, the space having a dimension less than a particular feature size, and wherein said second set of phase shift regions assist definition of only a portion of the second feature, the portion including only the second edge of the second feature.

21. The medium of claim 17, wherein said identified pattern further includes a second feature having a second edge, the first edge of the first feature and the second edge of the second feature separated by a space, the space having a dimension less than a particular feature size, and wherein said second set of phase shift regions assist definition of only a portion of the second feature, the portion including only the second edge of the second feature, and the instructions further comprising:
laying out a complementary mask having opaque and clear regions defining at least the first feature and the second feature.

22. The medium of claim 17, wherein said identified pattern further includes a second feature having a second edge, the first edge of the first feature and the second edge of the second feature separated by a space, the space having a dimension less than a particular feature size, and wherein said second set of phase shift regions assist definition of only a portion of the second feature, the portion including only the second edge of the second feature, and wherein the first and second features are flag shaped.

23. The medium of claim 17, wherein the identified pattern includes a plurality of features having a dimension smaller than a second particular feature size, and wherein the phase shift mask defines the dimension of the plurality of features smaller than the second particular feature size.

24. The medium of claim 17, wherein the identified pattern includes a plurality of features having a dimension smaller than a second particular feature size, and wherein the phase shift mask defines the dimension of the plurality of features smaller than the second particular feature size, and the instructions further comprising:
laying out a complementary mask having opaque and clear regions preventing exposure of at least the plurality of features.

\* \* \* \* \*

UNITED STATES PATENT AND TRADEMARK OFFICE
CERTIFICATE OF CORRECTION

PATENT NO.       : 7,585,595 B2               Page 1 of 1
APPLICATION NO. : 10/920027
DATED            : September 8, 2009
INVENTOR(S)      : Christophe Pierrat It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1175 days.

Signed and Sealed this

Fourteenth Day of December, 2010

David J. Kappos
*Director of the United States Patent and Trademark Office*